United States Patent [19]

Richardson

[11] Patent Number: 4,864,228
[45] Date of Patent: Sep. 5, 1989

[54] ELECTRON BEAM TEST PROBE FOR INTEGRATED CIRCUIT TESTING

[75] Inventor: Neil Richardson, Mountain View, Calif.

[73] Assignee: Fairchild Camera and Instrument Corporation, Mountain View, Calif.

[21] Appl. No.: 766,905

[22] Filed: Aug. 16, 1985

Related U.S. Application Data

[63] Continuation-in-part of Ser. No. 712,593, Mar. 15, 1985, abandoned.

[51] Int. Cl.$^4$ .............................................. G01R 31/26
[52] U.S. Cl. ................................. 324/158 R; 250/311
[58] Field of Search ....................... 324/158 R, 73 PC; 250/310, 311, 396 R, 396 ML, 397, 492.3

[56] References Cited

U.S. PATENT DOCUMENTS

| | | | |
|---|---|---|---|
| 3,628,012 | 12/1971 | Plows | 250/310 |
| 3,646,344 | 2/1972 | Plows | 250/310 |
| 4,169,244 | 9/1979 | Plows | 250/310 |
| 4,419,581 | 12/1983 | Nakagawa | 250/396 ML |
| 4,426,577 | 1/1984 | Koike et al. | 250/397 X |
| 4,437,009 | 3/1984 | Yamazaki | 250/310 X |
| 4,442,355 | 4/1984 | Tamura et al. | 250/397 X |

(List continued on next page.)

FOREIGN PATENT DOCUMENTS

| | | | |
|---|---|---|---|
| 58-197644 | 11/1983 | Japan | 250/310 |
| 198837 | 11/1983 | Japan | 250/311 |

OTHER PUBLICATIONS

Wittry, D., "Instrumentation for Electron Probe Microanalysis", Sep. 1, 1959.

(List continued on next page.)

Primary Examiner—Jerry Smith
Assistant Examiner—Stephen M. Baker
Attorney, Agent, or Firm—Fitch, Even, Tabin & Flannery

[57] ABSTRACT

An improved electron beam test probe apparatus and a method for use of said apparatus for use in measuring the potential in a specimen which enables measurements to be insensitive to local electric fields in the vicinity of the point at which the potential of the specimen is being measured. The apparatus consists of an electron beam for bombarding the specimen at the point at which the potential of the specimen is to be measured, a magnetic lens for collimating the secondary electrons emitted fom the specimen in response to this bombardment, and a detector system for measuring the energy distribution of the secondary electrons so collimated. Tubular electrodes are employed in the energy distribution detection system. These electrodes have significantly higher field uniformity and intercept a smaller fraction of the secondary electrons than wire mesh electrodes. The electrodes are supported on insulators constructed from slightly conductive plastic which prevent the buildup of static charges which can lead to unpredictable fields. The electron beam used to bombard the specimen is of a substantially lower energy than that used in scanning electron microscopes, thus reducing the problems associated with the high energy electron beam bombardment. Improved electronic delay circuitry which employs a tandem combination of a digital delay technique and an analog delay technique has been developed to allow the electron beam to be turned on in short pulses in precise time synchrony with test signal patterns applied to a circuit being tested. This delay circuitry allows the timing of these short pulses to be specified to an accuracy of 5 picoseconds relative to a trigger pulse which is applied to the delay circuitry several milliseconds earlier. An improved signal averaging circuit has been developed which improves the signal to noise ratio and response time.

The apparatus may be used to produce an image of the specimen in the vicinity of the point under bombardment while measuring the potential at said point. The methods taught by the present invention allow the measurement or the potential on buried conductors located beneath an insulating layer. The methods taught also prevent drift in the electron beam resulting from varying surface electric fields on the specimen.

2 Claims, 10 Drawing Sheets

U.S. PATENT DOCUMENTS

| | | | |
|---|---|---|---|
| 4,486,660 | 12/1984 | Feuerbaum | 324/158 R X |
| 4,539,477 | 9/1985 | Feuerbaum et al. | 324/158 R X |
| 4,551,625 | 11/1985 | Lischke et al. | 324/158 R |
| 4,581,534 | 4/1986 | Todokoro et al. | 250/310 |
| 4,587,425 | 5/1986 | Plows | 250/310 |
| 4,658,137 | 4/1987 | Garth et al. | 250/310 |

OTHER PUBLICATIONS

IBM Technical Disclosure Bulletin, Groeninck et al., "Integrated Circuit Full Wafer Diagnostic...", vol. 21, No. 2, Jul. 1978, pp. 638–639.

Scanning Electron Microscopy, Feuerbaum, H., "VLSI Testing Using the Electron Probe", 1979, pp. 285–296.

IBM Technical Disclosure Bulletin, Herman, P. et al., "Phax Control...", vol. 18, No. 3, Aug. 1975, pp. 870–871.

IBM Technical Disclosure Bulletin, Malm, "Reduction of Stray Fields about SEM Samples", vol. 21, No. 7, Dec. 1978, pp. 2973–2974.

Oatley, C. W., Nixon, W. C., and Pease, R. F. W., Advance in Electronics & Electron Physics, vol. 21 (1965) pp. 182–247.

Academic Press, Inc., New York, "Scanning Electron Microscopy".

Kruit, P., and Read, F. H., J. Phys. E: Sci. Instrum. vol. 16, (1983) pp. 313–324, "Magnetic Field Paralleliser for 2-$\pi$Electron–Spectrometer and Electron–Image Magnifier".

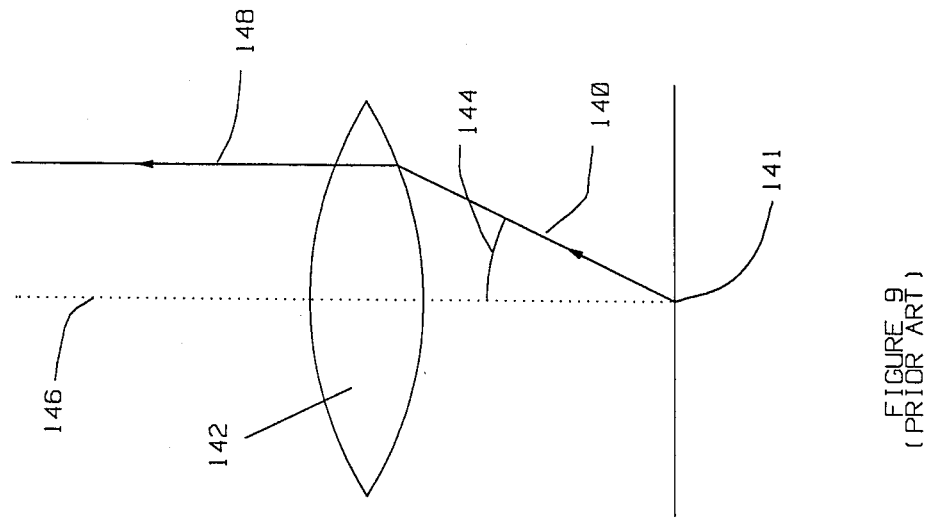
FIGURE 9 (PRIOR ART)
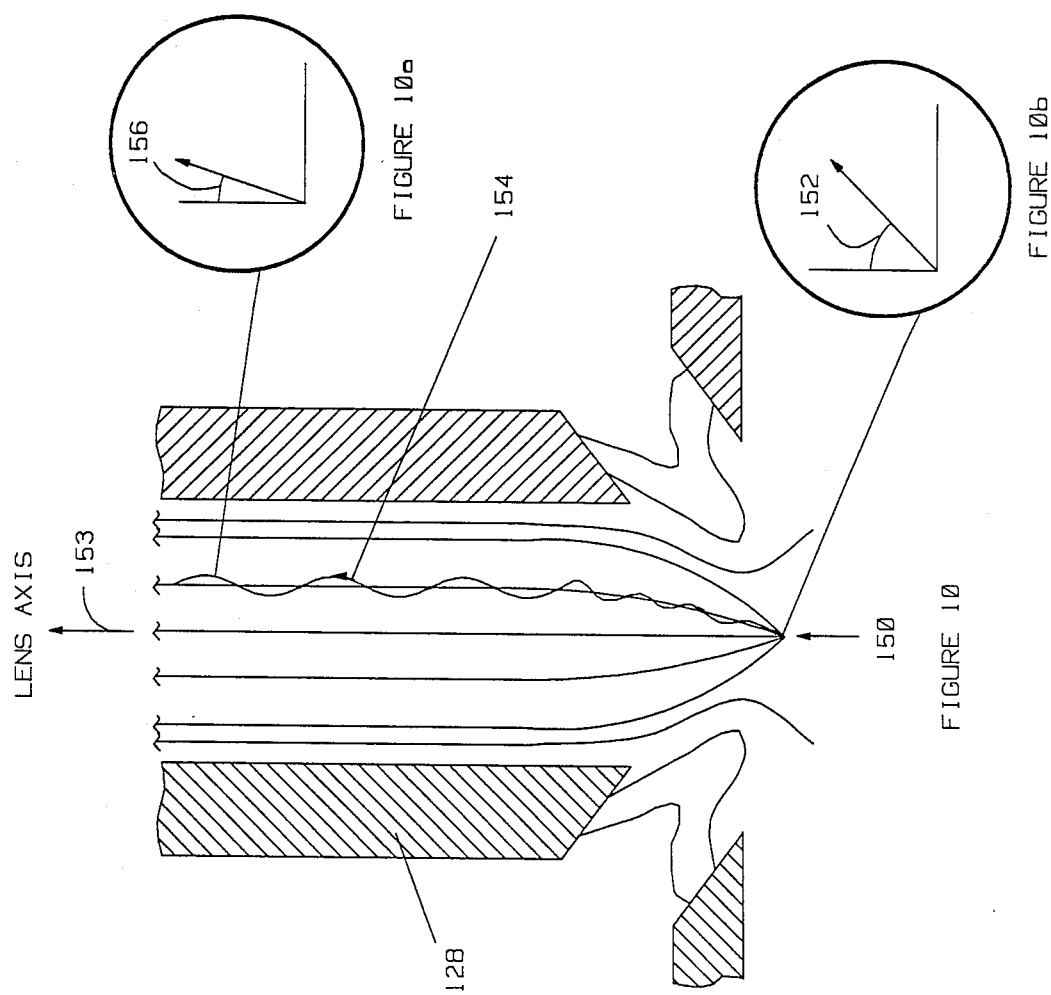
FIGURE 10a
FIGURE 10
FIGURE 10b

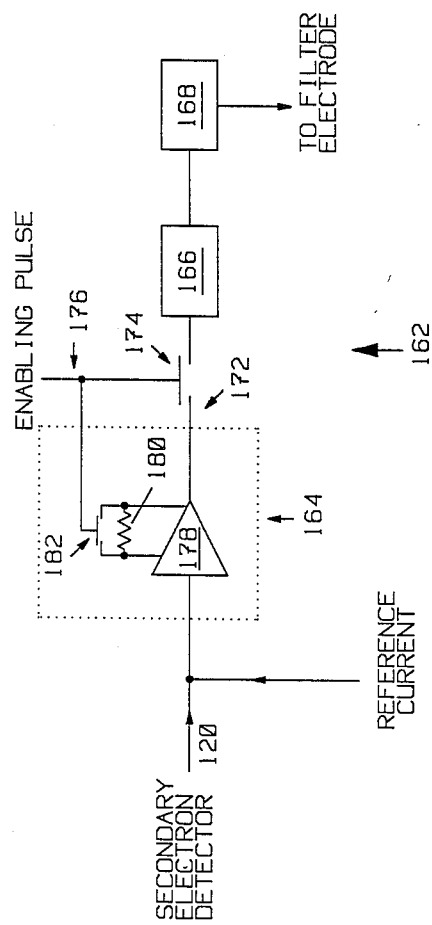

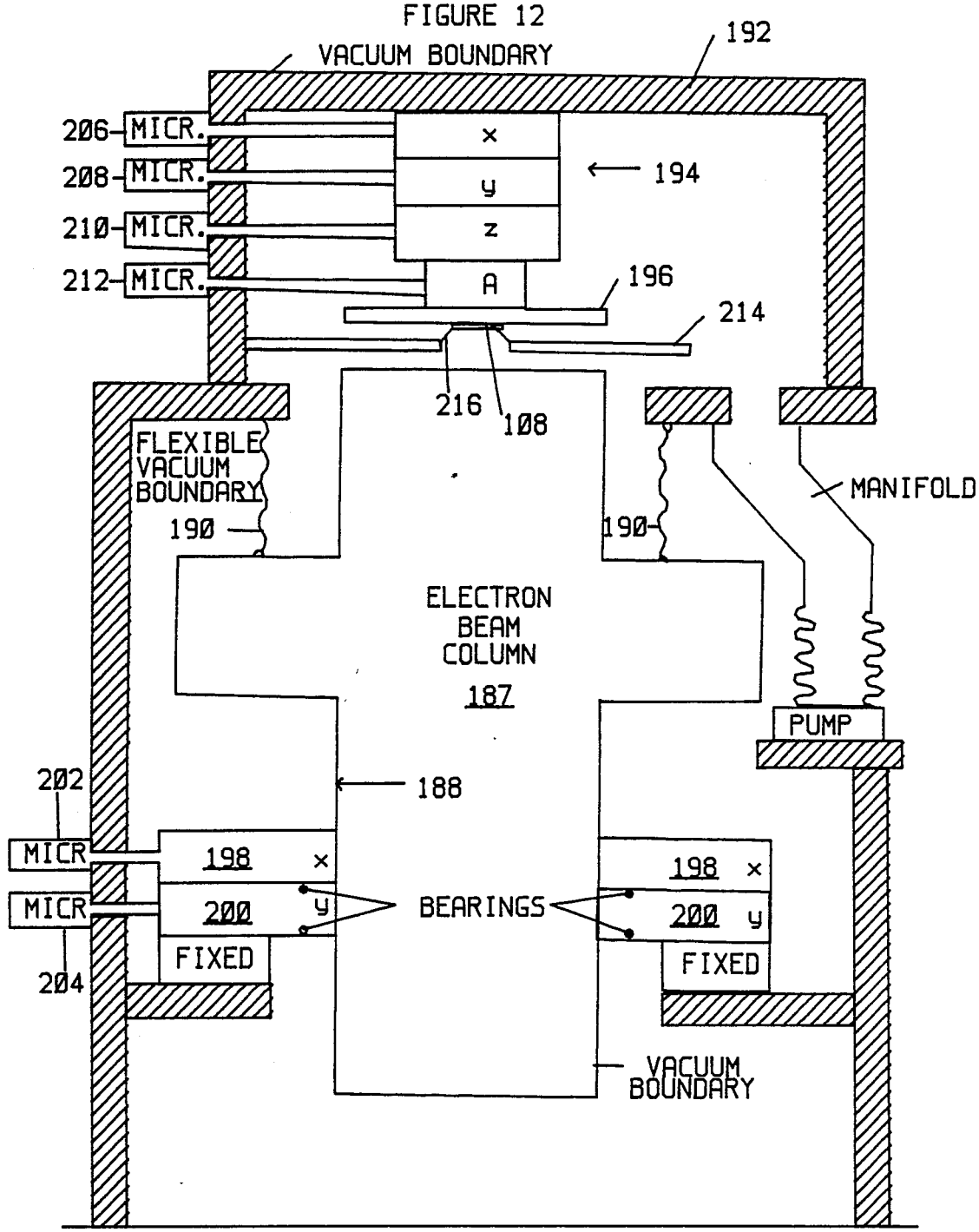

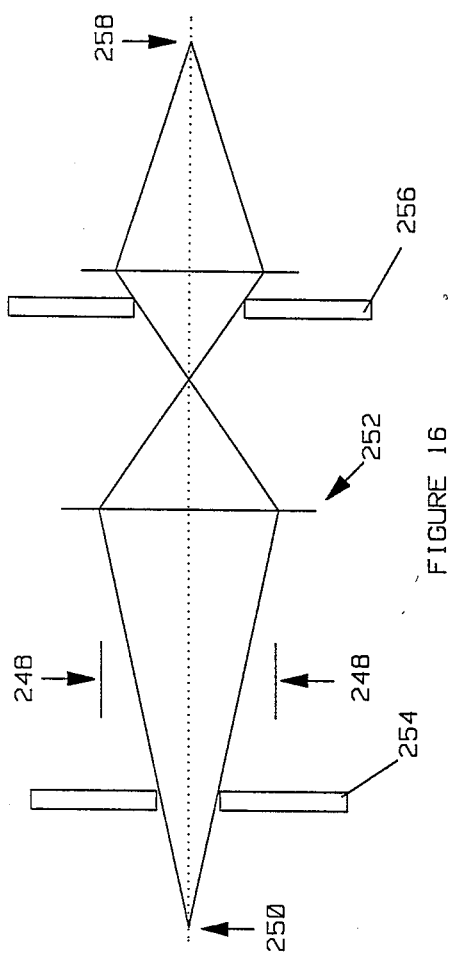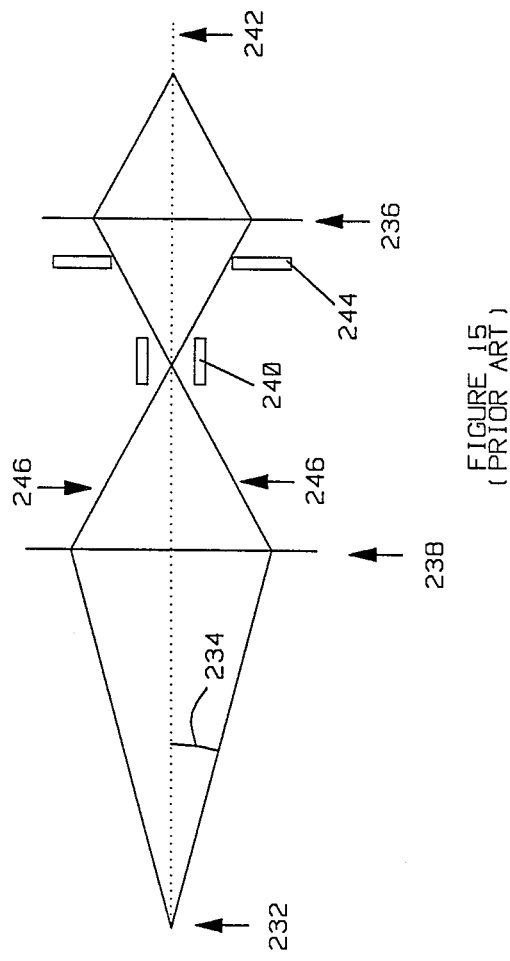

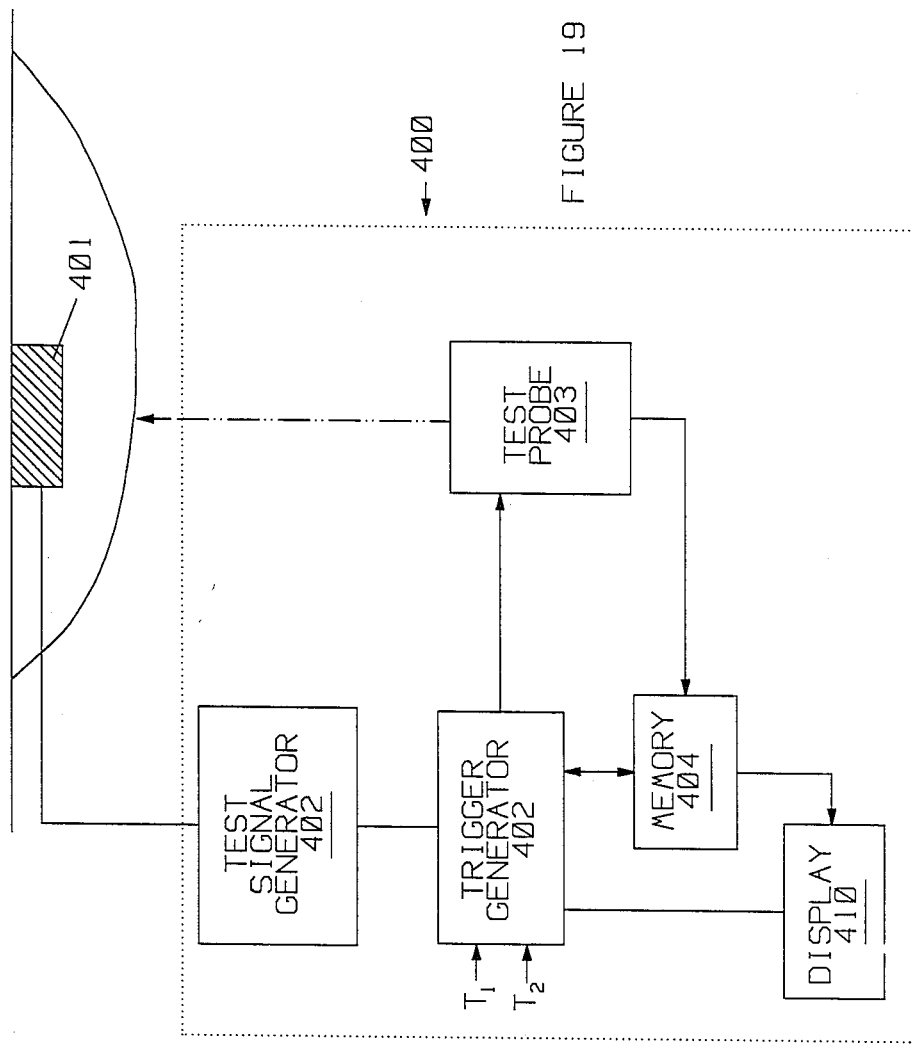

ELECTRON BEAM TEST PROBE FOR INTEGRATED CIRCUIT TESTING

This application is a continuation-in-part of my copending application entitled "SEM Electrical Test Probe with Energy Filter in the Lens and Improved Lens Design for an SEM", U.S. Ser. No. 712,593, filed Mar. 15, 1985, now abandoned.

BACKGROUND OF THE INVENTION

The present invention relates generally to the field of scanning electron microscopes and more particularly to scanning electron microscopes used as test probes for visualizing and testing integrated circuits.

As a result of progress in the design and fabrication of integrated circuits, it has become possible to create circuits having millions of conductors and transistors in which the individual conductors and nodes are of the order of one to two microns. These circuits are too small and complex to be amenable to testing and analysis by techniques using mechanical probes. The mechanical probes tend to capacitively load the circuits under test thus altering the behavior one wishes to measure. Further, the mechanical probes may actually physically damage the minute conductors and nodes with which they come in contact. Finally, the number of nodes which must be examined to debug a VLSI integrated circuit is rapidly becoming too large to be amenable to manual measurement, one node at a time. As a result, test probes based on electron beams have been developed. These test probes provide a means for measuring the potential on minute conductors as well as a means for forming an image of the conductors and the surrounding circuitry without any physical damage thereto.

FIG. 1 illustrates the basic principle on which electron beam test probes operate. When a beam of electrons of sufficient energy strikes a conductor, secondary electrons are emitted having an energy distribution which is a function of the potential on the conductor. Typical energy distributions for conductors at ground and $-5$ V are shown in FIG. 2. In addition to the secondary electrons, some of the electrons from the electron beam are also scattered in the backward direction by the conductor which gives rise to the small peak at or near the energy of the electron beam. These electrons are referred to as backscattered electrons. If the conductor under bombardment is at a negative potential of 5 volts, then each of the secondary electrons leaving the conductor will have an additional energy of 5 volts resulting from the repulsion of the electron by the negative potential of the conductor. Hence, the energy distribution shown in FIG. 2 for a conductor at ground potential will be shifted by 5 volts when the conductor is at a negative potential of 5 volts. Conversely, if one observes the energy distribution of secondary electrons emitted from the conductor under bombardment, one can in principle deduce the potential of the conductor.

Prior art electron beam test probes have been based on scanning electron microscopes. These are best exemplified by the work of Plows, e.g., U.S. Pat. No. 3,628,012. The apparatus taught by Plows is shown schematically in FIG. 3. An electron beam from a scanning electron microscope was directed on the conductor under observation. The secondary electrons leaving the conductor with sufficient velocity in a direction parallel to the electron beam to overcome a retarding field generated by a filter grid were measured by a detector.

The Plows apparatus has several problems. First, the measured value for the potential of the conductor under bombardment is dependent on the electric fields in the neighborhood of the point of bombardment. This is primarily the result of the means chosen to measure the energy of the electrons, i.e., choosing to measure the component of the secondary electron velocity parallel to the direction of the incident electron beam. Referring to FIG. 4, each secondary electron may be characterized by a velocity v and an angle of emission, T, relative to the direction of the electron beam. The number of secondary electrons emitted at an angle, T, is proportional to the square of the cosine of T. The secondary electron velocity vector v can be decomposed into a component, $v_p$, parallel to the direction of the electron beam and a component, $v_r$, perpendicular to the direction of the electron beam. Since the retarding field generated by the filter grid only affects the $v_p$ component of the velocity, the number of electrons which succeed in traversing the grid is a measure of the number of secondary electrons with $v_p$ greater than some predetermined value, not a measure of the number of electrons with total velocity greater than a predetermined value. As a result, secondary electrons emitted with large velocity and T at or near 90 degrees will not be counted, and secondary electrons emitted with much smaller velocities at or near 0 degrees will be counted.

Another problem with prior art electron beam test probes is that the angle of emission, T, may be altered by electric fields in the vicinity of the point of emission of the secondary electrons, as illustrated in FIG. 5. Here, a secondary electron which is emitted at an angle near 90 degrees, passes over a second conductor which is at a negative potential. This negative potential gives rise to a local electrical field which deflects the secondary electron in question, resulting in its effective angle of emission being decreased. As a result, a secondary electron which would not have been counted by the detector will now be counted. This results in "crosstalk" between the conductor being probed and the neighboring conductor. A signal on the neighboring conductor will appear as a signal on the conductor being probed, since the potentials generated by the signal on the neighboring conductor will increase or decrease the number of electrons counted by the detector whenever said signal becomes negative or positive, respectively. This is a serious problem in the prior art designs.

In addition to cross-talk, the sensitivity of the measured potential to local electric fields results in drift in the measured potential as the result of slow changes in the surface potential of the circuit being probed. The regions between the conductors on the integrated circuit accumulate charge as a result of bombardment by the electron beam when it is moved from one point to another. Such charge build-up also occurs as a result of scanning the entire circuit area to form an image of the circuit prior to deciding which point on the circuit is to be probed. Since these areas of the circuit have relatively high resistivity, this charge results in electric fields which slowly decay in time. Since the prior art systems are sensitive to electric fields in the neighborhood of the point being probed, these systems display long term drift in the measured potential as a result of the slow discharge of the areas between the conductors.

The prior art solution to this problem was to place an extraction grid at a large positive potential just above the surface of the circuit being tested. This grid attracts the secondary electrons away from the surface of the circuit so as to minimize the effects of surface electric fields. Unfortunately, this grid is not capable of overcoming all of the surface potential effects. In particular, it does not eliminate cross-talk between neighboring conductors. In addition, this grid often results in the surface of the circuit becoming highly positively charged, since any electrons which escape the surface of the specimen are swept away by this grid. Hence, if the electron beam is of an energy at which more than one secondary electron is emitted by the specimen for each electron absorbed, the specimen will become increasingly positively charged until the surface charge reaches a value which neutralizes the extraction grid field. This surface charge may also create adverse effects on the operation of the circuit under test.

Stray electric fields in other parts of the apparatus also affect the measured potential by either altering the trajectories of the secondary electrons or by altering the trajectory of the electron beam. For example, the extraction and filter grids must be positioned and supported by insulators. These insulators collect electric charges in a non-reproducible manner as a result of being struck by electrons which are not completely collimated into the electron beam, by backscattered electrons, and by secondary electrons. The prior art solved this charge buildup problem by employing complicated grounded shields the insulators in question which prevented stray electrons from striking the insulators and which shielded the electron beam and the secondary electrons from any fields which were produced by charges that made it past these shields and accumulated on the insulators in question.

Similarly, stray electric fields can affect the electron beam deflection system. The electron beam is often swept across the circuit by magnetic deflection. The electron beam must pass through the sweep magnets in a tube which must be conductive enough to prevent charge build up but resistive enough to prevent eddy currents from interfering with the response time of the sweep magnets. One prior art solution to this problem employs an insulating tube with a thin layer of carbon on the inside surface. This solution is economically unattractive.

The considerable space needed between the specimen and the last magnetic lens in the electron beam optical system to accommodate the filter and extraction grid assemblies in prior art systems gives rise to a second major deficiency in these systems. This space is determined by two considerations. First, the electron beam and secondary electrons must pass through these grids; hence the space between the wires used to construct the grids must be large compared to the diameter of the wires. If it is not, a significant fraction of the electron beam and secondary electrons will be intercepted by the grids. Second, in order for such an open grid to be an ideal potential barrier, the distance between the extraction grid and the filter grid must be large compared to the spacing between the wires that make up the grids. As a result of these two considerations, a significant distance, D, must exist between the bottom of the last focusing magnet in the electron beam column and the specimen as shown in FIG. 6. This large space limits the spot size of the electron beam on the conductor being probed.

Referring to FIG. 6, the last magnet in the electron beam column focuses the electron beam to a spot on the specimen at the point being probed. The minimum size of this spot is determined by the chromatic aberration of this magnetic lens. The chromatic aberration of the magnetic lens is roughly proportional to its focal length. The focal length of the prior art magnetic lens used for this purpose was at least as long as the distance from the bottom of the lens to the specimen. Hence the space needed to accommodate the extraction and filter grids forced the prior art systems to use a long focal length magnetic lens which in turn resulted in a large chromatic aberration. This chromatic aberration limits the spatial resolution of the prior art systems.

The fact that prior art systems were essentially modified scanning electron microscopes, results in a third class of problems. A normal scanning electron microscope is optimized to have the best possible spatial resolution. A resolution of 5/1000 of a micron is not unusual. This requires a high energy electron beam, typically 10 to 20 keV. The problems created include first, that this high energy beam can interfere with the operation of a circuit being tested. Second, it produces high backgrounds of electrons from backscattered electrons striking the walls of the containment vessel. These electrons limit the signal-to-noise ratio of the probe. Finally, it prevents the construction of a small compact instrument.

More specifically, a 20 keV electron beam can penetrate a significant distance into the surface of the integrated circuit being tested. This penetration can result in the charging or discharging of isolated gate elements in the circuit being tested. Such charging and discharging can result in permanent circuit damage.

Second, a significant fraction of the electron beam is backscattered by the specimen being tested. These backscattered electrons strike the walls of the vacuum vessel and produce secondary electrons with energies in the range detected by the electron detector. The number of such secondary electrons produced by each backscattered electron increases as the energy of the backscattered electrons increase. At 20 keV, these secondary electrons are a significant source of noise in the test probe instrument.

Finally, the physical size of the apparatus is constrained by the energy of the electron beam, the larger the electron beam energy, the larger the physical size of the apparatus. In most scanning electron microscopes, the electron beam is caused to scan the specimen being tested by magnetic deflection coils. The size and power dissipation of the deflection coils and the magnetic lenses used to focus the electron beam are directly related to the energy of the electron beam. At 20 keV, these coils dissipate sufficient power that they must be cooled, which complicates the physical design. To accommodate this cooling, the magnetic deflection coil is usually located outside the vacuum chamber. This requires that the vacuum chamber contain a tube which passes through each magnetic deflection coil. This geometry complicates the vacuum vessel and increases its cost. In addition, the distance from the magnetic lens to the specimen increases with increasing electron beam energy. This constrains the minimum height of the electron beam column.

Prior art test probe systems have also not been designed so as to be useable by someone who has not been trained in the maintenance and use of electron microscopes. They generally have been complex machines which require a great amount of tuning by the operator before desired images can be obtained.

Scanning electron microscopes are optimized for making images of small areas on the specimen. Test probe systems must be optimized for measuring rapidly changing voltages at a specified point which may be anywhere in the integrated circuit.

This leads to two further problems when such devices are adapted for use as test probes. First, the physical size of a typical VLSI integrated circuit is much larger than the "field of view" of the typical scanning electron microscope. As a result, only a small portion of the circuit may be probed at any one time. Second, the time required to measure the potential at a specified point is often too long. Since the measured potential is the average of the potential on the conductor over the time required to make the measurement, this can lead to inaccuracies if the potential on the conductor changes significantly over the potential measurement.

To avoid this second problem, the electron beam must be pulsed in very short pulses at precisely defined times relative to the test signals which govern the operation of the circuit. This imposes design constraints which are not properly incorporated in the design of the prior art systems. For example, the timing circuits used to control the electron beam pulsing often limit the frequency of the electrical signals that can be measured by these systems.

Finally, integrated circuits often contain conductors which are covered by a layer of insulating material. A means for measuring the potentials on such buried conductors is needed. The potentials on these conductors give rise to electrostatic potentials on the surface of the insulating layer. Thus it should be possible to measure the potential of the underlying conductor. However, prior art systems have not provided a satisfactory method for measuring these potentials. In prior art systems, the electron beam bombardment of the insulating material surface led to a change in potential of said surface which in turn made it difficult to deduce the potential of the underlying conductor.

Consequently it is an object of the present invention to provide an electron beam test probe system which is less sensitive than prior art systems to electric fields at points on the specimen other than at the point on the circuit which is being probed.

It is another object of the present invention to provide an electron beam test probe system which has an improved signal-to-noise ratio.

It is a further object of the present invention to provide a compact, easy to use electron beam test probe system which is suitable to production line use.

It is yet another object of the present invention to provide a test probe that can measure the potential on a VLSI integrated circuit at any point within the physical boundaries of said integrated circuit even though said boundaries may exceed the field of view of a scanning electron microscope.

It is a still further object of the present invention to provide an electron beam test probe system which can measure high frequency electrical signals.

It is a still further object of the present invention to measure the potentials of conductors covered by an insulating layer.

Finally, it is an object of the present invention to provide a test probe system which can produce an image of the circuit being tested while simultaneously measuring the potential at one or more of a plurality of selected points in the circuit being tested.

These and other objects of the present invention will be apparent from the following detailed description of the present invention and from the accompanying drawings.

SUMMARY OF THE INVENTION

The present invention consists of an improved electron beam test probe apparatus and a method for use of said apparatus which enables measurements to be less sensitive than prior art systems to local electric fields in the vicinity of the point at which the potential of the specimen is being measured. The apparatus of the present invention consists of an electron beam for bombarding the specimen at the point at which the potential of the specimen is to be measured, a magnetic lens for collimating the secondary electrons emitted from the specimen in response to this bombardment, and a detector system for measuring the energy distribution of the secondary electrons so collimated. The limitations caused by the angular dependence of prior art detection systems are greatly reduced by the use of a magnetic lens to collimate the secondary electrons prior to measuring the energy distribution of said secondary electrons. A tubular electrode is employed in the energy distribution detection system. Such an electrode has significantly higher field uniformity and intercepts a smaller fraction of the secondary electrons than the wire mesh electrodes used in prior art systems. The electrodes used in the present invention are supported on insulators constructed from slightly conductive plastic which prevent the buildup of static charges which led to unpredictable fields in prior art systems. The electron beam used to bombard the specimen is of a substantially lower energy than that generally used in scanning electron microscopes, thus reducing the problems associated with the high energy electron beam bombardment of prior art systems. Improved electronic delay circuitry which employs a tandem combination of a digital delay technique and an analog delay technique has been developed to allow the electron beam to be turned on in short pulses in precise time synchrony with test signal patterns applied to the circuit being tested. This delay circuitry allows the timing of these short pulses to be specified to an accuracy of 5 picoseconds relative to a trigger pulse which is applied to the delay circuitry several milliseconds earlier.

In addition, an improved signal averaging circuit has been developed which improves the signal-to-noise ratio of the voltage measurements and which has a faster response time than prior art signal averaging circuits The circuit employs an operational amplifier having a gain which is set to zero during periods when only noise signals are present. This results in better frequency response as well as lower noise.

The apparatus may be used to produce an image of the specimen in the vicinity of the point under bombardment while measuring the potential at said point. In addition, methods taught by the present invention allow the measurement of the potential on buried conductors located beneath an insulating layer. The method taught also prevents drift in the electron beam resulting from varying surface electric fields on the specimen.

BRIEF DESCRIPTION OF THE DRAWINGS

FIG. 9 illustrates the collimation of photons by an optical lens.

FIG. 10 illustrates the collimation of the secondary electrons by the collimating magnetic lens used in the preferred embodiment of the present invention.

FIG. 11 is a schematic diagram of a "boxcar" integration circuit according to the present invention.

FIG. 12 illustrates the mechanical adjustments provided according to the present invention for moving the electron beam column relative to the specimen.

FIG. 13 illustrates the relationship between the number of secondary electrons emitted from an insulator per electron in the bombarding electron beam and the energy of the bombarding electron beam.

FIG. 15 illustrates the placement of the blanking electrodes in a typical prior art electron beam test probe system.

FIG. 16 illustrates the placement of the blanking electrodes in a test probe according to the present invention.

FIG. 17 shows a buried conductor on a specimen and the electrical charge distribution produced in response to a positive potential applied to said conductor.

FIG. 19 illustrates the measurement of the potential on a buried conductor utilizing the present invention.

DETAILED DESCRIPTION OF THE INVENTION

Column Overview

Figure 4:
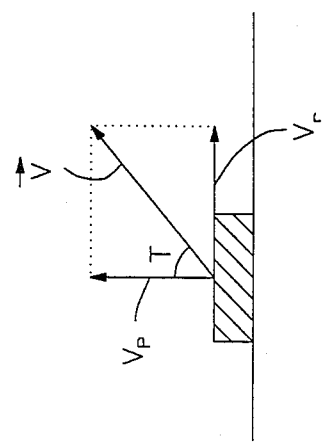
FIG. 4 illustrates the decomposition of the secondary electron velocity vectors into components which are parallel and orthogonal to the direction of the electron beam.
Figure 3:
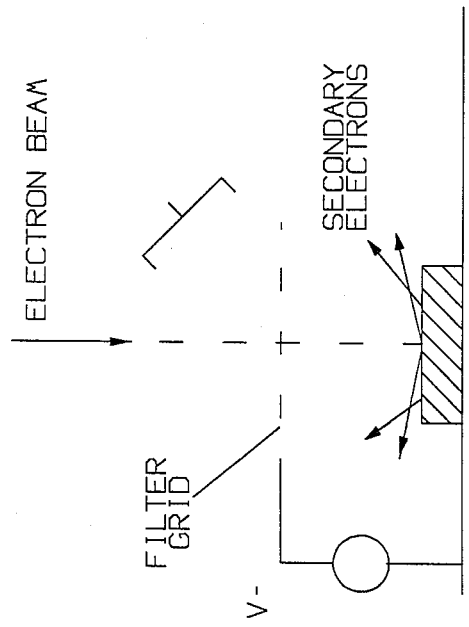
FIG. 3 illustrates the basic method and apparatus used by prior art electron beam test probe systems.
Figure 1:
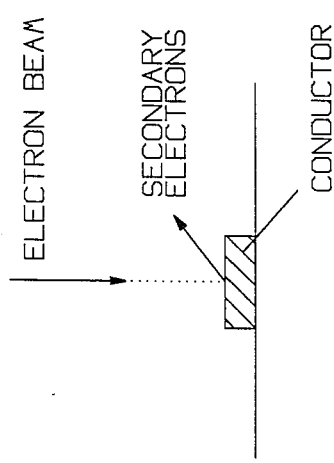
FIG. 1 illustrates the basic principle on which electron beam test probes operate.
Figure 2:
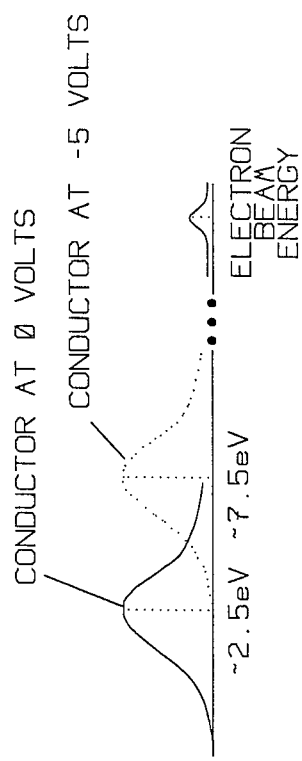
FIG. 2 illustrates the energy distribution of electrons leaving a conductor after bombardment with an electron beam.
Figure 6:
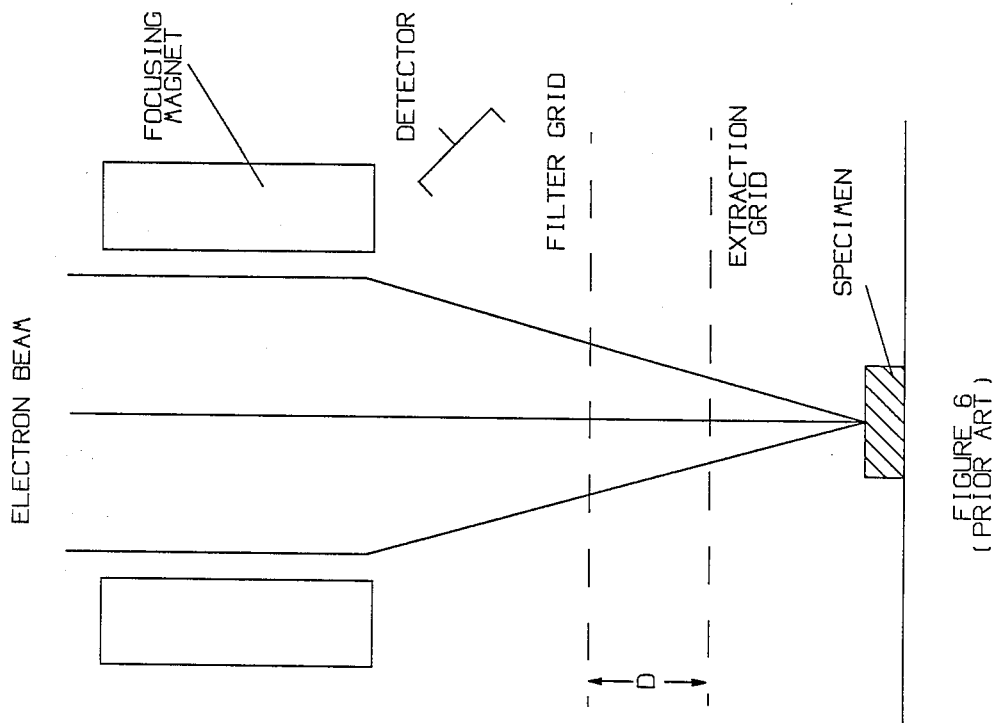
FIG. 6 illustrates the prior art problems resulting from the need to employ two grids between the specimen and the focusing magnetic lens.
Figure 5:
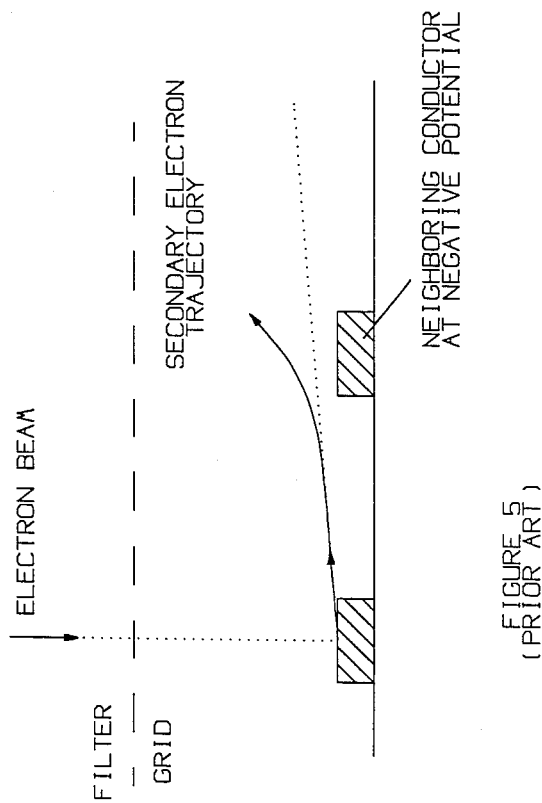
FIG. 5 illustrates the alterations in the secondary electron flight paths resulting from electric fields generated by neighboring conductors.
Figure 7:
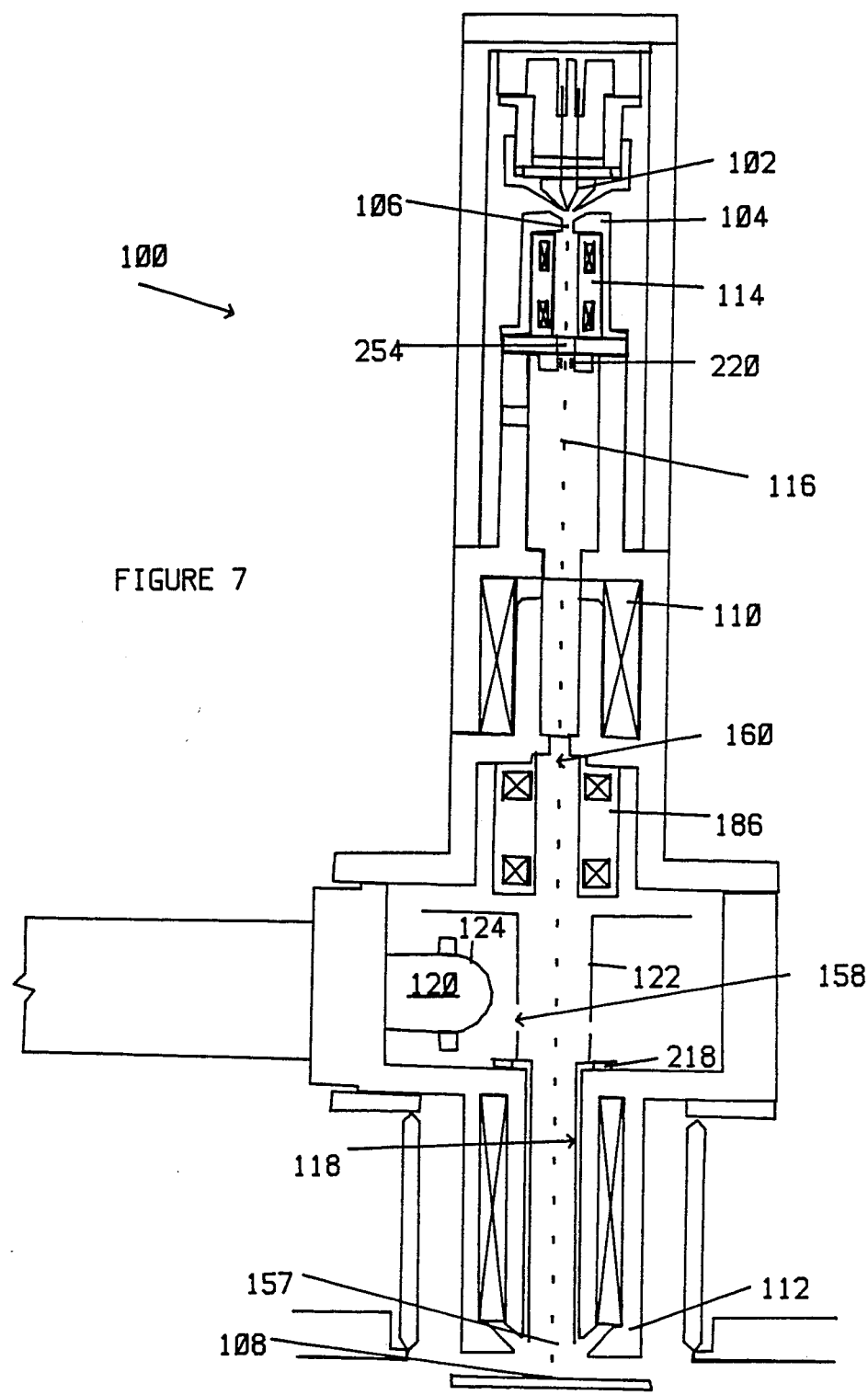
FIG. 7 shows a test probe according to the present invention.

A test probe constructed according to the present invention is shown schematically at 100 in FIG. 7. It consists of an electron beam source consisting of a tungsten filament 102 which emits electrons when heated by passing an electric current through it. The factors which influence the design of the electron beam source will be discussed below. These electrons are accelerated by a potential difference maintained between the filament 102 and an acceleration electrode 104. The electrons accelerated by electrode 104 are then formed into an electron beam by the orifice 106 in electrode 104.

The electron beam is focused onto a point in a specimen 108 by two magnetic lenses, magnetic lens 110 and collimating magnetic lens 112. Deflection coils 114 are used to correct for any slight misalignment between the filament 102 and the axis 116 of the electron beam column. The secondary electrons produced in response to the bombardment of the specimen 108 by this electron beam are formed into a second collimated beam by the collimating magnetic lens 112. This second collimated beam travels in a direction parallel to that of the electron beam used to bombard the specimen 108 and in a direction opposite to that of said bombarding beam. Those secondary electrons with sufficient energy to pass through a filter electrode 118 are deflected into a secondary electron detector 120 by the combination of a negative voltage applied to a suppressor electrode 122 and a positive potential applied to the surface 124 of the secondary electron detector 120.

Collimating Magnetic Lens

Figure 8B:
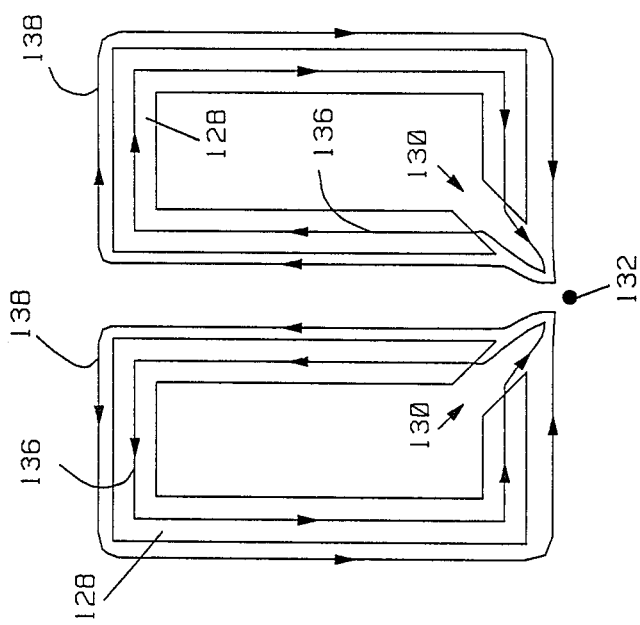
FIG. 8(b) illustrates the magnetic flux pattern produced by the collimating magnetic lens shown in FIG. 8(a).
Figure 8A:
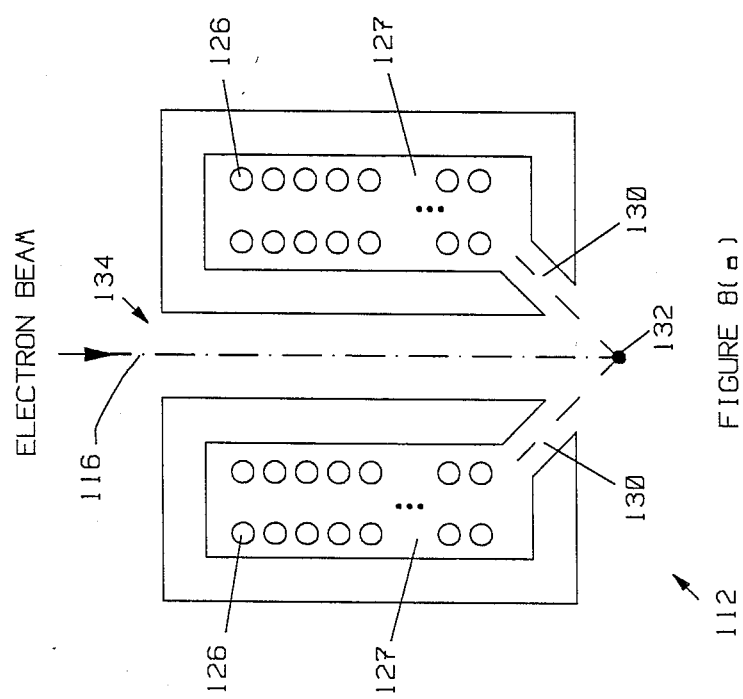
FIG. 8 (a) is a cross-sectional view of the collimating magnetic lens used in the preferred embodiment of the present invention.

The cross-section of the collimating magnetic lens 112 is shown in greater detail in FIG. 8(a). In the preferred embodiment, the collimating magnetic lens 112 consists of a coil 126 wound in an annular duct 127 formed in a pole piece 128 having a slot 130 slanted downward toward the point 132 at which the specimen is bombarded by the electron beam. The pole piece 128 is toroidal in shape having a passageway 134 which is cylindrical in shape with an axis coincident with the axis 116 of the electron beam column. The pole piece is constructed from a ferromagnetic material having a high magnetic permeability.

When a current is passed through the coil 126, a magnetic field is generated as illustrated in FIG. 8(b). The magnetic field so produced forms a magnetic circuit in which the field lines lie in a plane which is perpendicular to the direction of the wires in the coil 126. Since the pole piece is constructed of a high magnetic permeability material, most of this magnetic circuit is constrained to flow through the pole piece 128 as illustrated by flux line 136. However, since the slot 130 does not contain such highly permeable material, the flux lines "bulge" out at the position of the slot forming a region of intense magnetic field at the point 132. The small fraction of the magnetic field which is not constrained to the pole piece 128 forms a region of uniform weaker magnetic field in the bore 134 of the magnetic lens as illustrated by flux line 138.

The collimating magnetic lens 112 operates on the secondary electrons in a manner analogous to the action of an optical lens on the photons emitted from a point light source located at the focal point of the lens. This is illustrated in FIG. 9. Assume, for example, that a photon 140 from a source 141 is emitted at the focal point of the optical lens 142 and travels towards lens 142 at an angle 144 with respect to the axis 146 of the lens. When photon 140 strikes lens 142, its direction of travel is altered such that when it leaves the lens, it is traveling parallel to the axis 146 of the lens, as shown at 148. Similarly, an ideal magnetic lens would alter the direction of travel of a secondary electron emitted at its focal point such that the secondary electron in question would travel in a direction parallel to the axis of the magnetic lens independent of the angle at which said secondary electron was emitted from the source.

This collimation of the secondary electrons greatly facilitates the measurement of the secondary electron energy distribution and eliminates the "cross-talk" present in prior art electron beam test probe systems. Since a magnetic field which is constant in time can not impart any energy to an electron, only the direction of travel of the electrons is altered. This collimation thus results in all of the velocity being concentrated in the velocity component parallel to the axis of the lens. Hence, after collimation of the electrons by the magnetic lens, a measurement of the velocity component parallel to the axis of the lens is equivalent to a measurement of the total velocity of each electron and hence its energy. This measurement will be independent of the angle at which the secondary electron was emitted from the specimen and substantially independent of subsequent deflections by neighboring electric fields. Hence the "cross-talk" which resulted from the deflection of the secondary electron by neighboring conductors is substantially reduced. Thus, the introduction of the collimating magnetic lens 112 corrects one of the major problems in prior art electron beam test probe systems.

Unfortunately, it is much more difficult to create an ideal magnetic lens than it is to create an ideal optical lens. However, Kruit and Read (J. Physics E:Sci. Instrum., Vol. 16, p. 313, 1983, Great Britain) have shown that a good approximation to such an ideal magnetic lens may be constructed by creating a magnetic field which has an intense region of magnetic flux at the point of emission of the secondary electrons, said field diverging to a region of uniform magnetic flux in which the lines of magnetic flux are parallel to the axis of the lens. This is illustrated in FIG. 10. Electrons emitted from a point 150 at an angle 152 with respect to the direction of the magnetic lens axis 153 are captured by the magnetic field and constrained to travel along a path determined by the magnetic flux lines as shown at 154. When the electrons enter the region of constant magnetic field, the angle of their velocity vectors will have been rotated to a new angle 156 which is significantly less than the original angle 152. Kruit and Read have shown that $$\sin(A)/\sin(B) = (B_f/B_i)^{0.5},$$

where A and B are the final and initial angles of the electron velocity vectors with respect to the axis of the lens, respectively, and $B_f$ and $B_i$ are the strengths of the magnetic field in the region of uniform magnetic field and in the region of intense diverging magnetic field, respectively. Hence, if the field in the region of the point of emission 150 of the electron is large compared to the field in the uniform field region, the electron will be collimated into a beam having a direction substantially parallel to the axis of the magnetic lens.

In the apparatus according to the present invention, this collimation effect results in the secondary electrons emitted from the specimen 108 entering the uniform field region of the magnetic lens in a direction which is essentially independent of the angle at which they were emitted from the specimen. As a result of this collimation, essentially all the secondary electrons which were emitted from the specimen are collected and their velocity vectors re-oriented such that they are parallel to the axis of the lens. Hence, the probability that a given secondary electron will be counted depends only on its energy and not on its angle of emission at the point at which the specimen was bombarded by the electron beam. Hence, artifacts such as cross-talk between neighboring conductors which resulted from the angular dependence of the energy filter are substantially reduced.

In addition, essentially all the electrons emitted from the specimen arrive at the energy filter. Prior art electron beam test probes only collected a small fraction of the secondary electrons emitted from the specimen. Since the time needed to measure the potential on the specimen to a given precision is inversely proportional to the fraction of the electrons which are collected by the energy distribution sensing means, the introduction of the collimating magnetic lens significantly reduces the time needed to measure the potential at a point on the specimen.

Since the collimation is not perfect, each electron will, in general, still have a small radial component of velocity in a direction perpendicular to the axis of the lens 112 which is coincident with the axis of the electron beam column 116. This component of velocity in combination with the magnetic flux in this portion of the magnetic lens 112 causes the electron to execute a spiral path about a field line parallel to the axis of the lens. So long as this radial component of velocity is small compared to the component of velocity parallel to the axis of the lens, the potential barrier will still discriminate between different energy electrons based on their total energies. This may be seen as follows. The energy, E, of an electron is related to its velocity, v, by $$E = 0.5\, mv^2,$$

where m is the mass of the electron.

The velocity, v, is related to the velocity components $v_p$ and $v_r$ by $$v^2 = v_p^2 + v_r^2,$$

where $v_p$ is the component of the velocity parallel to the axis of the magnetic lens and $V_r$ is component of the velocity perpendicular to said axis. If $v_p$ is much larger than $v_r$, v will be almost exactly equal to $v_p$. For example, if $v_r$ is 10% of $v_p$, v will only differ by about 1% from vp. Hence, perfect collimation is not needed to construct a system which enables secondary electrons to be separated according to their total energy when they left the specimen.

The magnetic lens 112 used in the apparatus of the present invention is unique in that the region of intense magnetic flux produced by this lens lies outside the physical boundary of the pole piece 128. As described above, this is accomplished by slanting the gap 130 in the pole piece in a downward direction toward the point at which the secondary electrons are emitted. Prior art magnetic lens designs which produce a region of intense magnetic flux locate this region inside the confines of the pole piece. This makes these designs unsuitable for use in a test probe designed for testing integrated circuits which may be located on wafers which are as large as 6 inches in diameter, and therefore cannot be positioned in the region of intense magnetic flux in prior art systems. In addition to the space needed to accommodate the specimen, a test probe must include space for circuitry and connections on one side of the specimen, as well as room to move the specimen in a plane perpendicular to the direction of the electron beam. This makes prior art collimating magnetic lenses even more impractical for measuring test points on such a structure.

In addition to removing the artifacts produced by electrostatic fields near the point of bombardment of the specimen by the electron beam, the collimation of the secondary electrons improves the energy resolution of the test probe and hence the accuracy with which the potential of the specimen can be determined. As pointed out above, prior art test probes only measured the distribution of the velocity components of the secondary electrons which were parallel to direction of the electron beam. Since this distribution depends both on the energy distribution of the secondary electrons and on the angular distribution of the secondary electrons' velocity vectors, it is considerably broader than the distribution of energies. Hence, the precision with which the peak (or any other parameter characterizing the distribution) can be determined is less than the precision with which the peak of the energy distribution can be determined. The accuracy with which the specimen potential may be determined is directly related to the accuracy of the determination of the peak of the distribution being measured. Therefore, prior art test probes have a significantly inferior potential measuring capability than the test probe of the present invention.

In addition to improving the energy resolution of the test probe and removing those problems associated with the dependency of the prior art system on the angle of emission of the secondary electrons, the collimating magnetic lens according to the present invention results in several additional improvements. First, a far larger fraction of the secondary electrons emitted from the specimen reach the secondary electron detector 120. In the prior art systems, a secondary electron had to have two properties to reach the detector. First, it had to have sufficient velocity in the direction parallel to the direction of the electron beam to overcome the potential barrier. Second, it would not be counted if its radial velocity component perpendicular to the above direction was too large. This radial velocity component causes the secondary electron to drift away from the axis of the electron beam column toward the walls of the vacuum vessel. If a secondary electron drifts into one of these walls before overcoming the potential barrier, it is lost. The collimating magnetic lens used in the present invention overcomes this difficulty, since the secondary electrons are collected by said magnetic lens before they can drift into a vacuum vessel wall or other structure in the apparatus. Once the secondary electrons are collimated in the region of uniform magnetic field, any remaining radial velocity component merely causes the secondary electrons to execute a spiral path about the lines of magnetic flux; hence they are not free to drift into the walls of the collimating magnetic lens at this point either.

A second improvement is that the collimating magnetic lens also collimates the electrons which were backscattered by the specimen. Thus collimated, these electrons are constrained to follow a spiral path about the field lines in the uniform field region of the magnetic lens. Hence, they are prevented from striking the walls of the containment vessel or of the magnetic lens. In prior art systems, these backscattered electrons often struck the walls of the vacuum vessel. Since the backscattered electrons are of much higher energies than the secondary electrons produced in the specimen, such a collision with a vessel wall or other object in the apparatus often resulted in the production of several background low energy electrons with energies sufficient to overcome the potential barrier and be detected as if such electrons had been emitted from the specimen as secondary electrons. These background electrons are a significant limitation on the signal-to-noise ratio of prior art test probe systems.

A third improvement provided by the collimating lens of the present invention is that the collimating magnetic lens relieves the need to place an extraction electrode between the specimen and the electrode used to create the potential barrier. Prior art systems used such an extraction electrode to partially overcome the effects of electric fields on the surface of the specimen. These electric fields resulted from the electron beam bombarding the insulating regions between the conductors in the course of either scanning a region on the specimen or moving the electron beam from one conductor to another conductor. The interaction of the electron beam with these insulating regions results in the insulating regions becoming charged. This charge in turn gives rise to electric fields near the surface of the specimen. When a conductor located in one of these charged insulating regions is bombarded by the electron beam, the secondary electrons emitted at large angles are deflected by these regions of electric field in a manner analogous to the deflection of the secondary electrons by potentials on neighboring conductors, as described above. Since these regions have high resistivities, this trapped charge only slowly leaks off. To overcome the effects of these essentially static electric fields, prior art electron test probe systems used an extraction electrode placed between the surface of the specimen and the filter electrode. This electrode was charged to a positive potential of several hundreds of volts. As a result, the secondary electrons emitted from a conductor being bombarded by the electron beam would be accelerated away from the surface of the specimen by this large positive electric field. This acceleration reduced the time the secondary electrons spent in the vicinity of these electrically charged regions. Since the deflection of the secondary electrons is proportional to the time they spend in the electric field produced by this surface charge, the extraction electrode reduces the magnitude of this deflection and hence partially compensates for adverse effects of these surface electric fields.

Although the extraction electrode used in prior art electron test probe systems reduced the effects of these surface fields, it often led to other artifacts which introduced additional problems. As noted above, an electron beam test probe for use in analyzing integrated circuits requires the use of a low energy electron beam to prevent circuit damage. As will be explained more fully below, when such a low energy electron beam strikes an insulating surface of the type found in the typical VLSI integrated circuit, more than one secondary electron is emitted from the surface for each electron beam electron which is captured by the surface. In the absence of an extraction electrode, the surface will equilibrate at a positive potential of about 4 volts. As will be more fully explained below, at this potential, some of the secondary electrons which are emitted by the surface in response to the electron beam bombardment will be drawn back to the surface by this potential. The equilibrium is obtained because at this surface potential, only one of the secondary electrons which was ejected from the surface in response to the electron beam bombardment will escape for each electron beam electron captured by the surface. If an extraction electrode is used, essentially all the secondary electrons which are ejected from the surface in response to the electron beam bombardment will be swept away by the extraction field. Since more electrons are removed from the surface by the extraction electrode than are captured from the electron beam, the surface becomes more and more positively charged as the bombardment continues. When the surface is finally charged to a potential which balances the extraction electrode potential (i.e., several hundred volts), equilibrium will be established. Unfortunately, a positive potential of several hundred volts on the surface of the specimen interferes with circuit operation. Thus, the use of the collimating magnetic lens of the present invention significantly improves the performance of an electron beam test probe.

A fourth improvement is that the effective focal length of the magnetic lens used in the preferred embodiment is essentially zero. This results in a significant improvement in the ability to focus the electron beam to a small spot on the surface of the specimen. In prior art systems, the distance between the specimen and the bottom of the final magnetic lens used to focus the electron beam onto the specimen had to be long enough to accommodate both the extraction electrode and the filter electrode which created the potential barrier. As a result, prior art systems suffered from substantial chromatic aberration which limited the extent to which the electron beam could be focused to a small spot on the specimen. This chromatic aberration increases as the focal length increases. The chromatic aberration results in electrons having different energies being focused at different distances from the lens. Since the electron beam contains a range of electron energies, chromatic aberration is a significant problem in prior art systems. By employing an extremely short focal length lens, the present invention avoids this degradation in performance.

Electron Source

Two factors influence the choice of electron source 102. First, the electron source should have as small a spread in electron energies as possible. The chromatic aberration of the electron beam optical system, i.e., magnetic lens 10 and the collimating magnetic lens 112, is proportional to the ratio of the spread in the energies of the electrons comprising the electron beam and the average energy of said electron beam. Hence reducing the electron beam energy from the 20,000 volt level used in conventional test probes and scanning electron microscopes to 1000 volts results in the chromatic aberration being increased by a factor of 20. Fortunately, the improvement in the chromatic aberration obtained by using a collimating magnetic lens having an essentially zero focal length compensates for this increase in the present invention.

Second, the vacuum requirements of the electron source should be as tolerant as possible. The lifetime of many electron sources will decrease drastically if they are run in a poor vacuum. However, operating in a poor vacuum is highly desirable both because it reduces the cost of the vacuum pumps and the pump-down time. The pump-down time can be a significant factor in the time required to complete a test on a circuit. Tungsten sources can operate in a relatively poor vacuum, e.g., $10^{-4}$ Torr. However, the spread in electron energies is relatively large for tungsten. Lanthanum hexaboride, on the other hand, has half the spread in energies of tungsten, but it requires a vacuum of $10^{-7}$ Torr to function properly. Since the present invention can tolerate the large energy spread of the tungsten cathode, it is preferred, because of its tolerance to poor vacuum conditions.

In test probe systems in which higher spatial resolution is necessary, further improvement in the chromatic aberration resulting from the electron source can be had by employing a dispenser cathode which is constructed from porous tungsten which is impregnated with barium calcium aluminate. Such cathodes are well known to those skilled in the microwave circuitry arts; however, they have not been used in electron test probes. The may be obtained from Spectra Mat of Watsonville, Calif. These cathodes have a spread in electron beam energies which is about half that of pure tungsten. In addition, they can be operated in relatively poor vacuums.

Secondary Electron Detector

As discussed above, the potential on the specimen can be deduced from the energy distribution of the secondary electrons. However, detailed measurement of the energy distribution is not necessary. It is sufficient to measure the number of secondary electrons having energies greater than a predetermined energy. This may be accomplished by measuring the number of electrons with velocities greater than a first predetermined value but less than a second predetermined value. The upper limit is used to distinguish the secondary electrons from backscattered electrons from the electron beam.

The velocities of the secondary electrons traveling parallel to the axis of the lens can be measured by any of a number of methods. In the preferred embodiment, a potential barrier is employed. If a potential barrier is provided by an electrostatic field having a direction parallel to the axis of the lens, those electrons with velocities parallel to the axis of the lens which are greater than a predetermined value which depends on the strength of said electrostatic field will overcome this barrier. The remaining electrons will be turned back toward the specimen. By measuring the fraction of the electrons passing the potential barrier as a function of the strength of the electrostatic field, the distribution of secondary electron energies can be obtained.

Referring to FIG. 7, the potential barrier used to sense the energy distribution of the secondary electrons is created by applying a potential to a filter electrode 118. In the preferred embodiment, the filter electrode 118 is a tubular electrode located in the bore of the collimating magnetic lens 112. It will be apparent to those skilled in the art that a uniform potential barrier will be created at the entrance 157 of said tubular electrode when a potential is applied to said tubular electrode, provided the diameter of said tubular electrode is small compared to its length. In the present invention, the length of the tubular electrode is preferably at least two times its diameter. The optimum placement of the filter electrode 118 is in the region of uniform magnetic field created by the collimating magnetic lens 112, since the secondary electrons are collimated in this region. If the filter electrode 118 were placed in the region in which the magnetic flux was diverging, the secondary electrons would also have diverging velocity vectors and hence the improvements in energy resolution obtained from collimation would be reduced.

The prior art test probes employ a filter electrode constructed from a conducting grid. A grid electrode is at best a compromise between two competing requirements. To form a uniform potential barrier, the spaces between the wires that make up the grid must be small compared to the diameter of the wires. However, if the wires occupy a significant fraction of the grid area, a significant fraction of the secondary electrons having sufficient energy to pass the potential barrier will be lost due to collisions with the wires. The present invention avoids these limitations, since no material exists in the bore of the tubular electrode which could intercept said secondary electrons.

Those secondary electrons which have sufficient energy to overcome the potential barrier created by the filter electrode 118 are "swept" into the secondary electron detector 120 by an electrostatic sweeping field created by a combination of a negative potential applied to suppressor electrode 122 and a positive potential applied to the surface 124 of the secondary electron detector 120. It will be apparent to those skilled in the art, that the positive potential applied to the surface 124 could also be applied to an electrode located between the secondary electron detector 120 and the suppressor electrode 122. In the preferred embodiment, the suppressor electrode is a tubular electrode having an axis that is parallel to that of the electron beam column. A section 158 is removed from the side closest to the secondary electron detector 120 to provide a passageway for the secondary electrons.

The potential applied to the suppressor electrode 122 is chosen to discriminate between secondary electrons from the specimen and backscattered electrons. The backscattered electrons have energies which are much larger than those of the secondary electrons. Hence, a much larger electrostatic field is required to sweep the backscattered electrons into the secondary electron detector 120. The potential applied to the suppressor electrode 122 is chosen to be high enough to sweep the secondary electrons into the secondary electron detector 120 and low enough to allow any backscattered electrons exiting from the filter electrode to continue into the bore 160 of the suppressor electrode 122. Most of these backscattered electrons eventually strike some structure above the suppressor electrode 122. Any low energy electrons produced by these collisions will not affect the potential measurement of the specimen, since such electrons will not be able to enter the secondary electron detector 120. The precise value for the suppressor electrode potential depends on the physical dimensions of the suppressor electrode 122 and its positioning relative to the other components of the electron beam column.

The secondary electron detector 120 is a scintillation detector in the preferred embodiment. This counter is constructed from a scintillating material which produces light when struck by charged particles. Such materials are well known to those skilled in the art of charged particle detectors. In the preferred embodiment, the scintillation material is P47 which may be purchased from PELCO of Tustin, Calif. The light produced by the scintillating material is transmitted to a photomultiplier tube which converts this light signal into an electrical signal having a magnitude representative of the number of secondary electrons striking the detector.

Other secondary electron detectors will be apparent to those skilled in the art of charged particle detectors. For example, the scintillation counter used in the preferred embodiment could be replaced by a solid state charged particle detector or a charge detector such as a faraday cup. A suitable electron multiplying device may be placed in front of the charge detector to increase the number of electrons detected by said detector. Any detector which produces a signal which can be related to the number of electrons striking it and which has a time response which does not limit the rate at which measurements are made would be suitable. The P47 phosphor was chosen because of its long lifetime under high intensity electron bombardment.

For any given filter electrode potential, the electrical signal from the secondary electron detector will be related to the potential on the specimen. Unfortunately, the relation is not linear. To provide a signal which is linearly related to the potential of the specimen, the test probe of the preferred embodiment employs a feedback circuit which adjusts the potential applied to the filter electrode 118. The filter electrode potential is maintained at a value which allows a predetermined fraction of the secondary electrons to reach the secondary electron detector 120. The filter electrode potential determined in this manner is linearly related to the potential on the specimen at the point being probed. If the specimen potential increases by a fixed voltage, the energy distribution of the secondary electrons emitted will be shifted by the same fixed voltage. This results in the filter electrode potential being increased by the same fixed voltage in order to maintain the condition which allows the same fraction of the secondary electrons to reach the secondary electron detector 120. Thus, the filter potential so adjusted is a signal which is linearly related to the potential on the surface of the specimen.

As will be explained below, the apparatus of the present invention is normally used in a mode in which the electron beam is pulsed for short periods of time. To reduce noise, the filter electrode potential is adjusted to allow a fixed fraction of the secondary electrons arriving at the detector during a fixed time window to be detected. In principle, one could merely average the secondary electrons which arrive at the secondary electron detector 120, since when the electron beam is off, no secondary electrons should be arriving at said detector. Unfortunately, electronic and other noise sources continue to produce noise events which can not be distinguished from an electron striking the secondary electron detector 120. These events continue even while the electron beam is off. By limiting the measurement to the period in which secondary electrons resulting from the electron beam pulse reach the secondary electron detector 120, the effects of noise produced outside this time window are eliminated. This type of averaging is often referred to as "boxcar" averaging.

A typical prior art boxcar averaging circuit is shown at 162 in FIG. 11. It consists of a current to voltage converter 164 which matches the impedance of the secondary electron detector to the remainder of the circuit, an integrator 166 which averages the signals from the current to voltage converter 164, and a buffer/level shifter 168 which adjusts the filter electrode potential in response to a signal inputted to it. This input signal is essentially an error signal representing the difference between the desired number of secondary electrons reaching the secondary electron detector 120 and the actual number reaching said detector. When more than the desired number of secondary electrons reach the secondary electron detector 120, the signal present at the input to the buffer/level shifter 168 will be positive and the buffer/level shifter 168 will increase the filter electrode potential which will in turn reduce the number of secondary electrons reaching the secondary electron detector 120. When too few secondary electrons reach the secondary electron detector, 120, the signal at the input to the buffer/level shifter 168 will be negative and the buffer/level shifter 168 will reduce the filter electrode potential which will in turn increase the number of secondary electrons reaching the secondary electron detector 120. In addition to matching the impedance of the secondary electron detector to the rest of the circuit, the current to voltage converter 164 also forms the difference between a reference current 170 used to specify the fraction of the secondary electrons which are to reach the detector and the current from the detector 120. Hence, the output of the current to voltage converter 164 is an error signal present at 172 which indicates the discrepancy between the desired fraction of secondary electrons reaching the detector 120 and the actual fraction of secondary electrons which reached the detector 120. This error signal is averaged in the integrator 166 over several electron beam pulses. A switch 174 blocks the integrator 166 from averaging the error signal 172 at times outside the time window corresponding to secondary electrons from the specimen 108 reaching the detector 120. This time window is specified by an enabling pulse on line 176. The averaged error signal is fed to the buffer/level shifter 168 which increases or decreases the filter electrode potential in a direction which will reduce the error signal.

When the detector 120 is not counting secondary electrons resulting from the electron beam interacting with the specimen, the output of the current to voltage converter 164 will be large. This is because this circuit can not distinguish between an "error", i.e., too few electrons reaching the secondary electron detector 120, which is the result of an improperly set filter electrode potential and an error which is the result of the electron beam being turned off. Hence, when the electron beam is turned on and off during each pulse, the output of the current to voltage converter 164 must swing through a large voltage range. This voltage range corresponds to the difference between the output of said current to voltage detector when no secondary electron detector signal is present at its input and the output of said detector when said input signal corresponds to that generated by the secondary electron detector when said detector is counting approximately the desired number of secondary electrons.

An operational amplifier is usually used to construct the typical current to voltage converter. Slewing problems in such amplifiers limit the rate at which this transition can be made and hence limit the minimum time window which may be employed. The apparatus of the present invention employs a unique current to voltage converter design which avoids these slewing limitations.

Referring to FIG. 11, the current to voltage converter 164 used in the apparatus of the present invention consists of a standard operational amplifier 178 whose gain is set by a resistor 180 in its feedback path and a FET switch 182 which is connected across resistor 180 and shorts out the resistive path through resistor 180 when switch 182 is on. The current to voltage converter thus has two states. In the first state, the resistance of the resistor 180 is shorted out by switch 182, such that a zero resistance feedback path exists. In this first state the gain of the operational amplifier 178 is substantially zero. This results in the voltage of error signal at the output 172 being set to zero even though the input current to it would normally result in the generation of a large signal at this output. The current to voltage converter 164 of the present invention uses switch 182 to short the gain resistor 180 at all times other than those at which secondary electrons are present at the secondary electron detector 120. This FET switch is driven by the same signal which drives the switch 174 which gates the error signal into the integrator 166. In the second state, switch 182 turns the current to voltage converter 164 on by inserting the resistance specified by resistor 180 into the feedback path. Since the input to the current to voltage converter 164 is at or near the correct input during the time window in which said non-zero resistance is inserted into the feedback path, the error signal at the output of the current to voltage converter 164 does not have to make large excursions. This greatly reduces problems from slewing that have been inherent in conventional boxcar averaging circuits.

In principle, the inclusion of the switch 182 removes the need for the switch 174 used in conventional boxcar averaging circuits. If switch 182 completely shorted out resistor 180, the gain of the operational amplifier would be zero, and no signal from the input of said operational amplifier would reach the averaging circuit 166. However, commercially available switches and operational amplifiers are not ideal. Hence, even when the switch 182 shorts out resistor 180, a small fraction of the signal present on the input to operational amplifier 178 reaches point 172. The second switch 174 assures that this small residual signal does not affect the averaging circuit 166.

Although the preferred embodiment of the present invention uses a potential barrier to sense the energy distribution of the secondary electrons, it will be apparent to those skilled in the art of charged particle detectors, that any of a number of energy sensing systems could be used in conjunction with the collimating magnetic lens 112 to sense the energy distribution of the secondary electrons emitted in response to the electron beam. For example, the time needed for the secondary electrons to travel from the specimen 108 to the secondary electron detector 120 could be measured. Since this time is inversely proportional to the velocity of the secondary electrons, such a measurement would provide the same information as a direct measurement of the velocities of the secondary electrons. Such a system could be constructed by pulsing the electron beam and then observing the time interval between each such pulse and the arrival of the secondary electrons at the secondary electron detector 120.

Choice of Electron Beam Energy

In the preferred embodiment, the energy of the electron beam is considerably lower than that used in prior art systems. Most prior art systems are essentially adaptations of scanning electron microscopes. As such, they are optimized for electron beam energies in the 10 to 20 keV range. The test probe of the present invention employs an electron beam energy in the 500 to 1500 volt range. As discussed above, a high energy electron beam can cause a number of problems including circuit damage, high backgrounds of secondary electrons from backscattered electrons, and undesired surface charging of the non-conducting portions of the specimen surface. Such high energies are warranted in scanning electron microscopes, since these instruments are optimized for examining very small features on the surfaces of the specimens being scanned. The resolution of an electron microscope is determined in part by the energy of the electron beam. For example, as mentioned above, the energy of the electron beam affects the chromatic aberration of the optical system. Raising the energy of the electron beam results in general in a reduction in the chromatic aberration of the system, since the chromatic aberration is proportional to the spread in the energy of the electron beam expressed as a percentage of the average electron beam energy. The spread in the electron beam energy is determined by factors such as the type of electron source used to generate the electron beam. These factors are insensitive to the acceleration voltage used to accelerate the electrons. Hence by doubling the electron beam energy, the chromatic aberration is halved. In addition, the resolution of the electron microscope is ultimately limited by diffraction effects similar to those which limit the resolution of a light microscope. The size of the smallest object which may be viewed is determined by the wavelength of the electron beam. Objects smaller than about one wavelength can not be viewed. The wavelength of the electron beam is inversely proportional to its velocity; hence high energy electron beams must be used to view very small details.

However, a test probe need only produce spots which are a fraction of a micron in diameter, since the conductors being probed are of the order of a micron in width. Electron beam energy is not the limiting factor in viewing objects in this range. Hence a test probe can operate satisfactorily at substantially lower electron beam energies than a standard scanning electron microscope.

The use of a low energy electron beam makes possible a number of simplifications in the test probe design which make the present invention more suitable for a production line instrument than prior art systems. For example, much smaller electromagnets are needed to focus and steer the electron beam according to the present invention. As a result, the magnetic lenses do not have to be water cooled. This greatly simplifies the preparation of the physical site at which the test probe is to be installed. In addition, the distances between the various magnetic lenses is reduced; hence, a test probe having a much shorter profile is possible. This allows system configurations in which the test probe may be physically moved relative to the specimen. Finally, as will be described in more detail below, the use of a low energy electron beam allows the apparatus of the present invention to be used to probe the potentials on conductors which are covered by insulating layers.

Electron Beam Positioning

Prior art test probe systems had insufficient "fields of view" to probe an entire VLSI circuit. In the present invention, this problem is overcome by providing both coarse and fine adjustment means for positioning the electron beam relative to the specimen. The fine adjustment means consists of steering magnets 186, shown in FIG. 7, which deflect the electron beam relative to the specimen. The steering magnets 186 can produce electron beam deflections in either of two orthogonal directions perpendicular to the direction of the electron beam. Thus, they may be used to scan a region on the specimen as well as to provide fine positioning of the electron beam on the specimen. This scanning motion can be used to construct an image of the surface of the specimen which is accentuated to show the different electrostatic potentials present on said specimen. Other uses of this scanning motion will be discussed below with reference to methods of using the test probe of the present invention.

In the preferred embodiment, said steering magnets consist of steering coils wound on slightly conducting plastic supports to improve their frequency performance as discussed in more detail below. It will be apparent to those skilled in the art that the steering magnets 186 could be replaced with electrostatic deflection plates which cause the electron beam to be similarly deflected when an appropriate potential is applied thereto.

The coarse adjustment means is illustrated in FIG. 12. The electron beam column 187 is mounted within a vacuum vessel having a boundary shown at 188, 190 and 192. This boundary also encloses a stage 194 having a platform 196 for holding the specimen 108 being probed. The electron beam column includes means for positioning the column, shown at 198 and 200, by translation in two orthogonal directions, x and y, perpendicular to the electron beam direction. The electron beam column may be moved using micrometers 202 and 204 which control the positioning means 198 and 200, respectively. In addition, the stage 194 provides a means for positioning the specimen by translation in any of three directions, x, y, and z and by rotation through an angle A about an axis parallel to the electron beam direction. The various translational movements carried out by the stage 194 are controlled by micrometers 206, 208, and 210. The rotational motion is controlled by a micrometer 212. In the preferred embodiment, these micrometers are controlled by stepping motors under computer control.

A flexible bellows 190 provides a means for maintaining the vacuum in the vessel when the electron beam column is moved with respect to the vacuum chamber. The bellows 190 allows the column positioning means to remain outside the vacuum vessel. This positioning means preferably utilizes conventional bearings or other lubricated surfaces to support the column load. Outgassing from such lubricants during the pump-down process increases the length of time needed to pump down the vacuum chamber when a new specimen is introduced into the test probe. In addition, the volume of the vacuum vessel which must be pumped down each time a specimen is introduced into the apparatus is also minimized in this design.

A probe card 214 provides a means for making electrical connections to the specimen 108 mounted on the platform or table 196. This probe card 214 contains a hole through which the electron beam passes.

One of the intended uses of the apparatus of the present invention is for making potential measurements on integrated circuits. As is well known to those skilled in the integrated circuit arts, integrated circuits are normally constructed on wafers containing hundreds of such circuits. The apparatus of the present invention may be used to examine an individual integrated circuit prior to its separation from other integrated circuits on the wafer. Such measurements are made using the present invention by positioning the desired integrated circuit, referred to as a die, in the field of view of the electron beam and then moving the electron beam to the various points on the die at which potential measurements are desired. The wafer is mounted on table 196 at 108. The positional controls 206, 208, 210, and 212 are used to position the desired die relative to the probe card 214. The probe card includes mechanical probes 216 for connecting power and test signals to the die under examination.

Once the desired die is correctly positioned relative to the probe card 214, the region of interest on said die is selected by translating the electron beam column 187 relative to the die using the coarse x-y positional controls 198 and 200. The region of interest is then examined using the steering magnets 186.

The substantial use contemplated for the present invention is to measure the potential of nodes in a circuit contained on the surface of the specimen 108. However, to locate a specific node, an image of the specimen in the region of the node must be compared with the circuit layout on the specimen, which is usually in the form of a mask showing the locations of the various components of the circuit. Hence in practice, one scans the region of the specimen containing the node in question, this region is displayed to an operator, and the operator then selects the exact point in the region at which the potential is to be measured. In prior art systems, the electron beam is then directed against this point and the potential as a function of time measured. This procedure often leads to artifacts resulting from electrostatic potentials on the surface. These potentials are created by the scanning operation used to find the point in question.

The surface of the specimen contains insulation areas between the various conductors which have very low conductivity. When the electron beam scans these areas, they become charged due to the interaction of the electron beam with the low conductivity material. This surface charge results in an electrostatic field which slowly decreases in strength as the surface charge in question slowly dissipates. This varying electrostatic field interacts with the electron beam, causing its position to drift as the field dissipates.

The method of the present invention avoids this problem by periodically refreshing the surface charge in the areas surrounding the node being measured. This is accomplished by periodically scanning the area around the node during the potential measurements. In the method taught by the present invention, the node of interest is first located by scanning the region in the vicinity of the node. The electron beam is then moved to the node in question and potential measurements are commenced. Periodically during these potential measurements, the electron beam is caused to scan the region around the node in question to refresh the surface charge on these areas. This results in the electrostatic field around the node being kept at a substantially constant value during the potential measurements. Hence, any drift in the electron beam position during these potential measurements resulting from changes in the local electrostatic fields is eliminated or at least minimized.

This method of maintaining the insulating regions at a constant potential is only possible in an electron beam test probe in which the electron beam has an energy below about 2 keV. The number of secondary electrons produced as a result of the bombardment of the electrons beam electrons is shown in FIG. 13. For electron beam energies above about 2 keV, less than one secondary electron is produced for each electron beam electron striking the insulating surface. This results in an accumulation of electrons on the surface. Since the surface in question is an insulator, this accumulated charge can not leak off. Hence, the surface will become progressively more negatively charged until the potential becomes high enough to effectively alter the energy of the electrons striking the surface.

If the electron beam energy is lowered to below about 2 keV, this large negative potential buildup may be avoided. As seen in FIG. 13, at electron beam energies in the 1 keV region, more than one secondary electron is produced for each of the electron beam electrons striking the surface. This results in the surface becoming positively charged, since more electrons leave the surface than are absorbed by it. As the surface becomes increasingly positively charged, some of the secondary electrons which leave the surface will be recaptured by the surface because of the positive charge. The higher the positive charge becomes, the larger the fraction of the secondary electrons which will be recaptured. This effectively reduces the number of secondary electrons emitted per incident electron, since although more than one secondary electron is emitted per electron beam electron, the lower energy secondary electrons are recaptured by the positive potential. Eventually, the surface will reach a stable positive potential at which one secondary electron escapes for each electron beam electron which is captured. This potential is about 4 volts for the insulating materials used on silicon VLSI chips. Hence, by periodically refreshing the surface charge, a stable potential of about 4 volts is maintained on the insulating surfaces. Since this potential remains substantially constant over the time during which the potential is being measured on nearby conductors, it does not result in beam drift.

It should be noted that prior art systems which employ extraction electrodes held at a positive potential near the surface of the specimen can not easily practice this method. The large positive potential of the extraction electrode results in all of the secondary electrons escaping from the surface. Thus, the surface becomes increasingly positively charged when a low energy electron beam is used, instead of reaching the above described 4 volt stable positive potential.

Slightly Conducting Plastic Supports

The support for the steering magnets 186 must contain a passage through which the electron beam passes. If this passage is made from an insulator, stray electrons will strike it and a static charge will build up on the surface of this passage. This static charge will produce electrostatic fields in the passage which will adversely affect the electron beam. The magnitude of this charge is not predictable or even reproducible. To avoid this charge buildup, a conducting support may be used. However, the changing magnetic fields produced by the steering coils will result in eddy currents in such a conductor. These eddy currents reduce the frequency response of the steering coils by creating magnetic fields of their own. To avoid these eddy currents, prior art systems employed insulating tubes which were coated with a thin layer of carbon. This thin carbon layer had sufficient conductivity to allow any static charge to leak off before it reached a magnitude that would interfere with the electron beam without having enough conductivity to allow significant eddy currents to be generated by the steering coils. This coating system is expensive, since it requires that a very thin layer of carbon be deposited on the surface of the insulating tubes after they have been formed. The apparatus of the preferred embodiment of the present invention avoids this expense.

The preferred embodiment employs a material which is a slightly conducting plastic for this purpose. Slightly conducting plastic has sufficient conductivity to allow any charge which builds up as the result of the capture of stray electrons to leak off. However, its conductivity is sufficiently low to prevent eddy current generation by the steering coils. Since the plastic can be easily molded and requires no subsequent carbon deposition after forming, it is a much more economically attractive solution to this problem.

The preferred slightly conducting plastic is made by incorporating carbon black into a non-conducting plastic. The preferred resistivity of the resultant plastic is $10^6$ ohm-cm. Satisfactory performance may be obtained with resistivities in the range of $10^4$ ohm-cm to $10^8$ ohm-cm. Plastics with these properties are obtainable from Wilson Fiberfil, Evansville, Ind., 47732.

Slightly conducting plastic is also used to form the insulating supports used to connect the various electrodes to the supporting structures in the apparatus of the present invention. For example, as seen in FIG. 7, the tubular filter electrode 118 is mounted to the collimating magnetic lens 112 by an insulator 218 made from slightly conducting plastic. The slight conductivity of the plastic allows any static charge which is present on the support to leak off. Thus the static charge buildup problems of prior art systems are avoided.

In prior art systems, such structures are mounted on conventional insulators. Electrons striking one of these insulators would in general become trapped on the insulator, since the insulator had too high a resistivity to allow the trapped charge to leak off. This trapped charge resulted in unpredictable electric fields which influenced the trajectories of both the electrons in the electron beam and the secondary electrons. To avoid these adverse effects, prior art systems employed complicated shields around such insulators. These shields were designed to intercept stray electrons before they reached the insulators in question and to shield the remainder of the apparatus from any electric fields resulting from electrons which managed to get past these shields and became trapped on the insulator in question. The use of slightly conducting plastics in the present invention avoids this economically unattractive solution to this charge build up problem.

Stroboscopic Operation of the Test Probe

Improvements in integrated circuit technology have led to circuits in which the potential at a given node can change in a time which is less than the time needed to measure the potential of said node using an electron beam test probe. The time needed to make an accurate potential measurement at a node is the time needed for the secondary electron detector 120 to collect a statistically significant number of secondary electrons. The test probe of the present invention can accumulate such a statistically significant number of secondary electrons in a shorter time than the prior art systems, since the collimating magnetic lens delivers a larger fraction of the secondary electrons leaving the node to the secondary electron detector. However, even with this significant improvement, it is not always possible to follow the potential changes at a node merely by observing the secondary electrons emitted from that node as a function of time.

This problem may be overcome by using stroboscopic techniques. Here, several measurements having limited numbers of secondary electrons are averaged to produce a single measurement having sufficient secondary electrons to be statistically accurate. The test signal pattern applied to the circuit being probed is periodic in nature. It consists of a series of signals which repeat in time. In stroboscopic systems, the electron beam is turned on for a short period of time at the same point in this test signal pattern. The point in the test signal pattern is specified by a delay time relative to some fixed point in this test signal pattern. The time that the electron beam is turned on must be small compared to the time period over which the test pattern potential changes, since the measured potential is the average of the potential on the conductor during the time the electron beam is turned on. Although the number of secondary electrons collected in each of these short time periods is insufficient to obtain a statistically accurate measurement, the average of the number of secondary electrons obtained over a large number of such time periods does provide a statistically significant measurement of the potential at the node in question.

Stroboscopic techniques require the test probe system to apply short pulses of electrons at the same point on the specimen at precisely the same time relative to a trigger pulse derived from the test signal pattern. Any fluctuations in the timing of the electron beam pulse relative to the trigger pulse will degrade the potential measurement. Fluctuations in the position of the electron beam on the specimen will also degrade the potential measurement if said fluctuations cause the electron beam to move off the conductor being probed.

The present invention includes a means for pulsing the electron beam in short pulses. This is accomplished by applying a suitable potential across the blanking electrodes 220 shown in FIG. 7. In the absence of a potential across said blanking electrodes, the electron beam is imaged by a magnetic lens 110 into the aperture 160. The collimating magnetic lens 112 then images the electron beam to a small spot on the specimen 108. When a potential is applied across said blanking electrodes, the electron beam is deflected sufficiently to prevent it from entering the aperture 160.

Although prior art systems teach the use of stroboscopic techniques, the circuitry provided in these prior art systems is of insufficient accuracy to view waveforms in the 1000 MHz range on the conductor being probed. To operate successfully in the stroboscopic mode, a test probe must bombard the circuit node on the specimen with bursts of electrons in which the duration of said bursts is small compared to the time in which the signal being probed changes significantly. Any variation in the timing of these pulses relative to the test signal pattern results in degradation of the potential measurement. The present invention samples the potential on the conductor in question over a time as small as 100 picoseconds. The time at which this pulse is applied to the specimen relative to the test signal pattern is determined by a delay circuit which triggers the blanking electrode circuitry at a specified time relative to a trigger pulse derived from said test signal pattern. If the delay time generated by this circuit varies by an amount which is a significant fraction of the electron beam pulse time, degradation in performance of the stroboscopic system will result. Hence, for electron beam pulses of 100 picoseconds, the delay circuit must produce a delay which varies by at most a small fraction of 100 picoseconds, e.g., 10 picoseconds, and yet provides delays of zero to several milliseconds.

Analog circuits which generate delays by charging or discharging a circuit element such as a capacitor to a predetermined voltage lack the required accuracy for such a high speed delay circuit. A 10 picosecond accuracy in a millisecond delay requires an accuracy of 1 part in 100,000,000 which is not attainable with such analog techniques. Nor can one obtain this degree of accuracy by using simple digital delay techniques in which a pulse is generated after a preset number of pulses from an oscillator circuit have been counted. Unless the oscillator always starts at same phase in its oscillation cycle, there will be an uncertainty of up to one half of one period of oscillation in the delay so generated. This uncertainty results from the uncertainty in the phase of the oscillator when the counting begins. Further, the minimum delay that can be generated with such a system is one period of the oscillator. Hence such a simple digital delay circuit would need an oscillator with a frequency in excess of 100 gigahertz. This type of circuit is economically unattractive.

Figure 14:
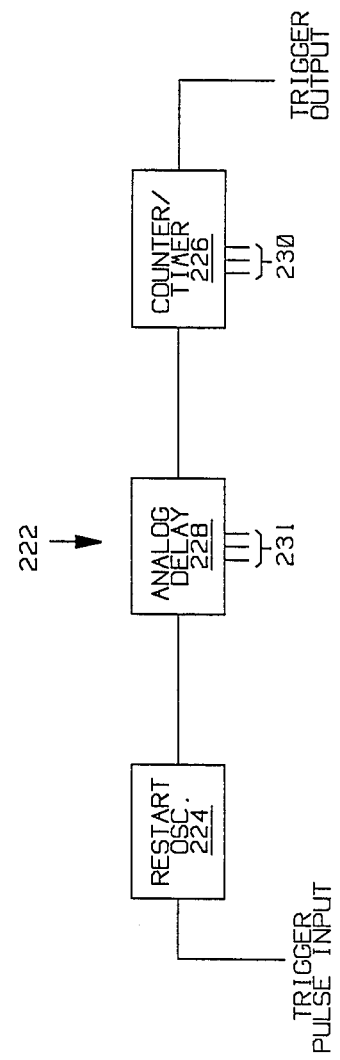
FIG. 14 is a schematic diagram for a delay circuit according to the present invention.

The apparatus of the present invention generates high accuracy long delays by combining a digital delay technique with an analog fine adjustment circuit. The digital delay provides a coarse delay. The analog delay circuit provides fine adjustments to this coarse delay time. This allows delays of less than one oscillator period to be generated. A restartable oscillator is employed to eliminate uncertainties created by not knowing the point in the oscillation cycle at which the counting began. The delay circuit of the present invention is shown schematically at 222 in FIG. 14. It consists of a restartable oscillator 224, a counter 226, and an analog delay circuit 228. The coarse delay is specified by signals 230 which specify the number of oscillator pulses which must be counted by the counter 226 before it produces an output pulse. The magnitude of the analog delay is specified by signals 231.

The restartable oscillator 224 always begins oscillating at the same phase of its waveform; hence, its period does not have to be small compared to the time period over which the electron beam burst is to take place. Such oscillators are well known to those skilled in the art of electronic circuits. Similarly, analog delay circuits are also well known to those in the electronic circuit arts. It is the use of the combination of the two delay techniques which results in a significant improvement over the prior art methods of generating the delay between the trigger pulse and the electron beam pulse.

The apparatus of the present invention employs a 200 MHz restartable oscillator. Hence, each count of the counter 226 corresponds to a delay of 5 nanoseconds. Each of these 5 nanosecond steps is further divided into 1000 5 picosecond steps by the analog delay circuit.

The placement of the blanking electrodes 220 has also been optimized to further improve the stroboscopic capabilities of the present invention. Three factors must be taken into account to properly optimize the position of said electrodes. First, the positioning of said blanking electrodes affects the amount of beam movement which occurs when the electron beam is turned on and off during a given electron beam pulse. During the rise and fall of the potential applied to the blanking electrodes, the electron beam will tend to move on the specimen. If the electron beam moves a distance which is small compared to the width of the conductor on which it is presumably centered, no adverse effects will occur since the entire conductor is at the same potential. However, if the electron beam moves off of said conductor, the potential measured will be a weighted average of the potentials encountered along its path. This can result in inaccuracies in the measured potential and in cross-talk with the potentials on neighboring conductors in the case where the electron beam moves to such a neighboring conductor.

Second, the magnitude of the blanking potential which must be applied to said blanking electrodes 220 to produce the desired electron beam blanking is a function of the position of said blanking electrodes. In general, large blanking potentials are to be avoided. Large potentials require more expensive circuitry. In addition, the rise and fall times of the blanking potential which are obtainable at a reasonable cost are less for smaller potentials than for larger potentials. It is these finite rise and fall times which make the movement of the electron beam during the pulsing of the electron beam a significant factor. If the potential applied to the blanking electrodes could be turned on and off in a time short compared to the length of the electron beam pulse, the contributions to the above mentioned weighted average of potentials from those points on the electron beam path off the conductor on which it is initially centered would be negligible.

Third, the accuracy with which the blanking electrodes 220 must be aligned relative to electron beam column axis 116 is also a function of the blanking electrodes' placement. Obviously, placing the blanking electrodes at a location which requires a precision alignment is to be avoided for economic reasons.

In prior art systems, the blanking electrodes were typically placed between two magnetic lenses as shown in FIG. 15. The electron beam source 232 emits electrons over a cone of angle 234. These electrons are imaged into the second magnetic lens 236 by the first magnetic lens 238. The blanking electrodes 240 are placed at the point at which the electrons imaged by magnetic lens 238 cross the axis 242 of the electron beam system. An aperure 244 intercepts the electron beam electrons when the blanking potential is applied. The magnitude of the blanking potential must be sufficient to deflect the electrons traveling along the extreme trajectories shown at 246 out of this aperture. This positioning of the blanking electrodes 240 produces the smallest electron beam movement during the rise and fall of the potential; however, it requires much higher potentials and alignment accuracies than would be required if the blanking electrodes 240 were placed between the first magnetic lens 238 and the source 232.

Referring to FIG. 16, the blanking electrodes 248 of the present invention are placed between the electron source 250 and the first magnetic lens 252. This results in an increase in the movement of the electron beam on the specimen when the electron beam is pulsed using the blanking electrodes relative to the movement which would be obtained had the blanking electrodes been placed between the magnetic lenses as described above. To limit this increase in the electron beam movement during electron beam pulsing, a first aperture 254 is placed between the electron source 250 and the blanking electrodes 248. A second aperture 256 intercepts the electrons which are deflected by the blanking electrodes 248 when a potential is applied to said blanking electrodes. In the absence of a potential on said blanking electrodes, the first magnetic lens 252 images the electrons which pass through the first aperture 248 into the second aperture 256. Three parameters must be optimized, the size of the first aperture 254, the placement of this aperture relative to the magnetic lenses, and the placement of the blanking electrodes relative to the magnetic lenses. The minimum size of the aperture 254 is determined by the physical size of the source 250. Although the source is shown in FIG. 16 as a point source, it is really of the order of 50 microns in diameter. If the aperture 254 is made significantly smaller than the source dimensions, it will significantly reduce the number of electrons which are focused on the specimen. Hence the aperture 254 is chosen to be of the order of the source dimensions. The placement of the aperture 254 relative to the source 250 and the magnetic lens 252 is chosen so as to minimize the movement of the electron beam at point 258 on the specimen during a change in the potential applied to the blanking electrodes 248. The placement of the blanking electrodes 248 relative to the source 250 and the magnetic lens 252 is chosen so as to minimize the potential required to deflect the electron beam out of the aperture 256. This position of the blanking electrodes 248 is chosen to be between one quarter and one half the distance between the source 250 and the magnetic lens 252. The optimum position of the aperture 254 is as close to the blanking electrodes 248 as is mechanically and electrically feasible. In the preferred embodiment shown in FIG. 7, this arrangement of apertures and lenses results in a source movement of less than 0.2 microns when a potential of only 5 volts is applied to the blanking electrodes. Prior art systems required blanking potentials of typically 40 volts. Since the conductors on the typical integrated circuit are of the order of 2 microns, this amount of motion can be tolerated.

Measurement of Potentials on Buried Conductors

The specimens to be measured in the apparatus of the present invention often contain conductors which are covered by a layer of insulating material as shown in FIG. 17. A potential applied to the underlying conductor 260 results in a potential being generated on the surface 262 of the insulating material 264. Hence in principle, one should be able to measure a waveform applied to the underlying conductor by measuring the potential of the surface of the insulator covering it. In practice, this is difficult to accomplish because of the alterations in this surface potential produced by the electron beam itself during the measurement process.

As discussed with reference to FIG. 13, the number of secondary electrons produced as a result of the electron beam bombardment is a function of the electron beam energy. For electron beam energies above about 2 keV, less than one secondary electron is produced for each electron beam electron striking the insulating surface. This results in an accumulation of electrons on the surface. Since the surface in question is an insulator, this accumulated charge can not leak off. Hence, the surface will become progressively more negatively charged until the potential becomes high enough to effectively alter the energy of the electrons striking the specimen surface. The surface potential at this point will be so large that any change in the specimen potential resulting from potentials applied to the underlying conductor will be too small to detect. Hence, prior art systems which employed a high energy electron beam could not measure the waveforms on conductors buried under an insulating layer.

If the electron beam energy is lowered to below about 2 keV, this large negative potential buildup may be avoided. In this case, as discussed above, the surface will reach a stable positive potential at which one secondary electron escapes for each electron beam electron which is captured. This potential is about 4 volts for the insulating materials used on silicon VLSI chips. This potential is sufficiently small to be able to observe differences in it produced by applying potentials of typically 5 volts to the underlying conductor.

When a positive potential of 5 volts is applied to the underlying conductor, the surface of the specimen will move from its equilibrium potential of roughly 4 volts to a potential of roughly 9 volts; the exact potential depending on the thickness of the insulating layer. Since the surface is now positively charged to a potential greater than the 4 volts equilibrium potential, a larger fraction of the secondary electrons will be recaptured by the surface. This larger recapture results in less of the secondary electrons reaching9 the electron detector; i.e., the test probe will measure a positive potential on the surface of the specimen. Hence, the reduction of the electron beam energy to below 2 keV allows one to measure the potential on the surface of the insulator. In the preferred embodiment, the electron beam has an energy of 1 keV.

Figure 18:
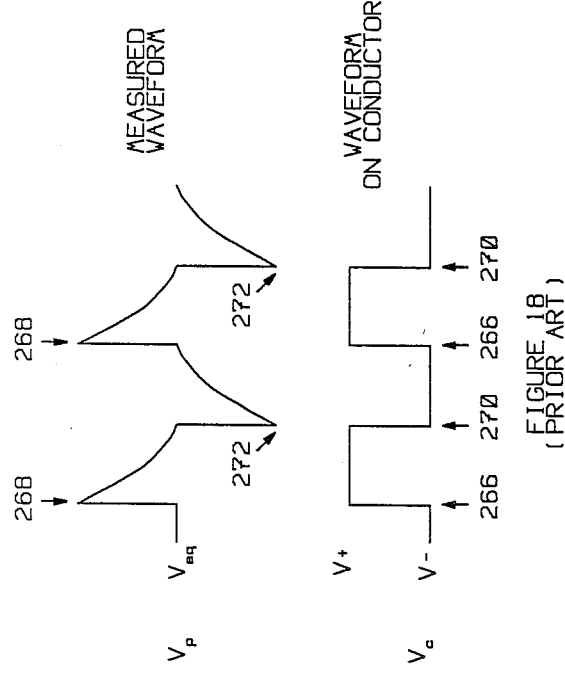
FIG. 18 illustrates the potential measured when a square wave is applied to the buried conductor shown in FIG. 17.

Unfortunately, the greater number of secondary electrons recaptured by the specimen surface result in the surface becoming progressively less positively charged until it again reaches the equilibrium potential. This is illustrated in FIG. 18. When the conductor potential $V_c$ changes from $V-$ to $V+$ as shown at 266, the surface potential $V_p$ initially rises from $V_{eq}$ and becomes more positively charged, which results in the number of secondary electrons emitted being reduced. This results in a positive potential being measured by the test probe as shown at 268. These additional secondary electrons which are recaptured result in the surface becoming less positively charged; hence, the measured surface potential decreases until it again reaches $V_{eq}$. If the potential $V_c$ on the underlying conductor is now returned to zero as shown at 270, the surface potential will suddenly decrease by $V+$. This will result in a larger number of secondary electrons escaping from the surface, i.e., the measurement will indicate a negative swing in the surface potential, as shown at 272. This increased number of secondary electrons escaping from the surface results in the surface becoming progressively more positively charged until it again reaches $V_{eq}$. In effect, the measured signal is differentiated. Hence, merely reducing the electron beam energy into the region in which more than one secondary electron is produced for each electron beam electron is not enough to measure the waveforms on the underlying conductors accurately.

This differentiation is the result of the surface capturing more secondary electrons than it losses during the $V+$ portion of the underlying waveform and losing more secondary electrons than it gains during the $V-$ portion of the waveform. The apparatus of the present invention as shown in FIG. 19 at 400 avoids this differentiation by ordering the potential measurements in time such that the secondary electrons gained during the $V+$ portion of the waveform tend to compensate for the secondary electrons lost during the $V-$ portion of the waveform. In the method of the present invention, a repetitive waveform is applied to the underlying conductor 401 by signal generator 402. Two times T1 and T2 using electron beam test probe 403 which specify the interval of said repetitive test pattern over which measurements are to be made are inputted to the present invention. Potential measurements are then made at random times between these two times by trigger generator 402 which is connected to a memory 404. Each measurement is stored in memory 404 along with the time at which it was made. When sufficient data is gathered to plot the potential as a function of time, the potential results are displayed on display 410. If the underlying waveform is at V+ half the time and V− the other half of the time, on average successive measurements will be made with the underlying conductor at V+ and then V−. The secondary electrons gained by the surface when the underlying conductor is at V+ are compensated for by the secondary electrons lost by the surface when the underlying conductor is at V−. Thus no net long term change in the surface potential of the conductor will result from the electron beam striking the surface during the measurement process. If the waveform applied to the underlying conductor is to half the time V+ and half the time V−, then the compensation will be less than perfect, but still significantly better than the prior art systems.

Various modifications of the present invention will be apparent to those skilled in the art without departing from the present invention as claimed below.

What is claimed is:

1. An electron beam test probe for measuring the potential of a specimen at a predetermined point on said specimen comprising:
   means for bombarding said specimen with an electron beam at said predetermined point on said specimen;
   collimating magnetic lens means for collimating the secondary electrons emitted from said specimen in response to said electron beam bombardment such that the velocity vectors of said secondary electrons become substantially parallel to an axis defined with reference to said magnetic lens means after said collimation;
   means for sensing the energy distribution of said collimated secondary electrons;
   means for defining a pulse interval;
   pulsing means for causing said electron beam to bombard said specimen only during said pulse interval;
   means for generating a trigger pulse; and
   timing means for specifying the timer of said pulse interval relative to said trigger pulse;
   means for coupling a repetitive test signal pattern to said specimen;
   means for defining first and second times relative to said test signal pattern, said first and second times specifying a time period relative to said repetitive test signal pattern during which potential measurements are to be made;
   means for generating successive said trigger pulses at times randomly chosen between said first and second times;
   means for storing data representing the energy distribution of the secondary electrons resulting from said electron beam pulse and sensed by said energy distribution sensing means and the time at which said trigger pulse was generated; and
   means for displaying said data as a function of the time at which said trigger pulse was generated.

2. A method for measuring the potential of a specimen in conjunction with a test probe apparatus including a means for directing a beam of electrons at a point on said specimen, a magnetic lens for collimating the secondary electrons resulting from the interaction of said electron beam with said specimen, an electron detector, means for applying a repetitive electrical test pattern to said specimen and means for pulsing said electron beam at a time relative to said test pattern, comprising the steps of
   a. selecting two times relative to said repetitive test pattern between which the potential measurements on said specimen are to be made;
   b. choosing a time randomly between said two selected times;
   c. storing the value of said randomly chosen time together with the number of electrons detected by said electron detector when said electron beam is pulsed at said randomly chosen time; and
   d. repeating steps (b) and (c) until sufficient potential measurements have been stored to calculate the potential on said specimen at a time between said two selected times.

\* \* \* \* \*

UNITED STATES PATENT AND TRADEMARK OFFICE
CERTIFICATE OF CORRECTION

PATENT NO. : 4,864,228

DATED : September 5, 1989

INVENTOR(S) : Neil Richardson

It is certified that error appears in the above-identified patent and that said Letters Patent is hereby corrected as shown below:

On the title pag, item [57]:
    Abstract (4 lines from the bottom) delete "or" insert --of--.
    Column 3, line 31, after "shields" insert --around--.
    Column 4, line 21, delete "." insert --,--.
    Column 10, line 42, delete "VP" insert --Vp--.
    Column 13, line 43, delete "10" insert --110--.
    Column 25, line 11, before "same phase" insert --the--.
    Column 25, line 33, after "signals" insert --on bus--.
    Column 25, line 36, after "signals" insert --on bus--.
    Column 28, line 17, after "reaching" delete --9--.
    Column 29, line 18, delete "to" (second occurrence) insert --not--.

Signed and Sealed this

Sixth Day of August, 1991

Attest:

HARRY F. MANBECK, JR.

*Attesting Officer*    *Commissioner of Patents and Trademarks*